United States Patent
Aina et al.

(10) Patent No.: US 9,671,489 B1
(45) Date of Patent: Jun. 6, 2017

(54) ELECTROMAGNETIC SENSOR AND OPTICAL DETECTION SYSTEM FOR DETECTING ANGLE OF ARRIVAL OF OPTICAL SIGNALS AND A RANGE OF A SOURCE OF THE OPTICAL SIGNALS

(71) Applicant: Epitaxial Technologies, LLC, Baltimore, MD (US)

(72) Inventors: Olaleye A. Aina, Baltimore, MD (US); Tom Pierce, Baltimore, MD (US); Ayub M. Fathimulla, Baltimore, MD (US)

(73) Assignee: Epitaxial Technologies, LLC, Baltimore, MD (US)

( * ) Notice: Subject to any disclaimer, the term of this patent is extended or adjusted under 35 U.S.C. 154(b) by 350 days.

(21) Appl. No.: 14/218,607

(22) Filed: Mar. 18, 2014

Related U.S. Application Data

(60) Provisional application No. 61/788,918, filed on Mar. 15, 2013.

(51) Int. Cl.
*G01S 7/48* (2006.01)
*G01S 3/781* (2006.01)
*G01S 3/782* (2006.01)
*H01L 27/146* (2006.01)
*H01L 31/0232* (2014.01)

(52) U.S. Cl.
CPC ............ *G01S 7/4804* (2013.01); *G01S 3/781* (2013.01); *G01S 3/782* (2013.01); *H01L 27/14625* (2013.01); *H01L 31/02327* (2013.01)

(58) Field of Classification Search
CPC ........ G01S 3/782; G01S 3/781; G01S 7/4804; G01S 13/78; H01L 31/109; H01L 31/03046; H01L 31/02327; H01L 31/1075; H01L 27/14625; H01L 27/14609
USPC ... 250/216, 239, 214 R, 214.1, 208.1, 208.2, 250/203.1, 206.1, 206.2; 257/431, 432, 257/436, 438, 443, 451, 461; 356/4.01, 356/4.07, 152.1
See application file for complete search history.

(56) References Cited

U.S. PATENT DOCUMENTS

| | | | | |
|---|---|---|---|---|
| 3,941,483 A | * | 3/1976 | Ferrin ..................... | G01S 3/783 250/203.2 |
| 4,086,711 A | * | 5/1978 | Gammarino .......... | F41G 3/2688 434/22 |
| 4,516,024 A | * | 5/1985 | Hudson ................ | G01C 11/025 250/236 |
| 4,857,982 A | * | 8/1989 | Forrest ................ | H01L 31/1075 257/186 |

(Continued)

*Primary Examiner* — Que T Le
*Assistant Examiner* — Jennifer Bennett
(74) *Attorney, Agent, or Firm* — Matthew J Lattig; Charter IP, LLC

(57) ABSTRACT

An optical detection system for detecting an incident optical signal is described. The system includes an optical package adapted to collect the incident optical signal and directed it to a detector array that is coupled thereto. The array outputs electrical signals to be analyzed by a processor. The processor is adapted to iterate algorithms using the signals to calculate an incident angle of arrival for the incident optical signal and a range of the source of the optical signal to the system based on the angle of arrival calculation. The processor is further configured to discriminate the optical signal spectrally to calculate wavelengths thereof for false alarm rejection.

17 Claims, 30 Drawing Sheets

(56) References Cited

U.S. PATENT DOCUMENTS

| | | | | |
|---|---|---|---|---|
| 5,075,750 A | * | 12/1991 | Kagawa | B82Y 20/00 257/189 |
| 5,202,742 A | * | 4/1993 | Frank | G01S 7/4811 180/167 |
| 6,104,297 A | * | 8/2000 | Danilychev | G01J 1/04 250/372 |
| 6,172,742 B1 | * | 1/2001 | Yamazaki | G01C 15/006 356/141.4 |
| 6,381,025 B1 | * | 4/2002 | Bornhop | G01B 11/026 348/E17.002 |
| 6,407,439 B1 | * | 6/2002 | Hier | B82Y 20/00 257/431 |
| 7,269,359 B1 | * | 9/2007 | McAdoo | H01L 31/1085 257/E31.066 |
| 7,683,310 B1 | * | 3/2010 | Sinclair | G01S 7/4804 250/203.1 |
| 9,052,381 B2 | * | 6/2015 | Woolaway | G01S 7/4863 |
| 2006/0023288 A1 | * | 2/2006 | McBrien | G02F 1/0356 359/245 |
| 2006/0060761 A1 | * | 3/2006 | Williams | G01S 17/895 250/221 |
| 2007/0196113 A1 | * | 8/2007 | Fathimulla | H04B 10/25 398/212 |
| 2009/0046272 A1 | * | 2/2009 | Ohishi | G01S 7/4818 356/5.01 |
| 2010/0277713 A1 | * | 11/2010 | Mimeault | G01S 7/487 356/5.01 |
| 2012/0320219 A1 | * | 12/2012 | David | G01S 7/483 348/169 |

* cited by examiner

2D DETECTOR ARRAY 106A

| | | |
|---|---|---|
| 200 Å | InGaAs | (p+) |
| 1,500 Å | AlInAs | (p+) |
| 500 Å | InGaAlAs | |
| 10,000 Å | InGaAs | |
| 500 Å | InGaAlAs | |
| 1,500 Å | AlInAs | (p-) |
| 2,000 Å | AlInAs | |
| 1,500 Å | AlInAs | (n+) |
| 5,000 Å | InGaAs | (n+) |
| InP substrate | | |

FIGURE 21

| | | |
|---:|:---|:---|
| | S1818 photoresist | |
| 200 Å | InGaAs | (p+) |
| 1,500 Å | AlInAs | (p+) |
| 500 Å | InGaAlAs | |
| 10,000 Å | InGaAs | |
| 500 Å | InGaAlAs | |
| 1,500 Å | AlInAs | (p-) |
| 2,000 Å | AlInAs | |
| 1,500 Å | AlInAs | (n+) |
| 5,000 Å | InGaAs | (n+) |
| | InP substrate | |

FIGURE 22

ELECTROMAGNETIC SENSOR AND OPTICAL DETECTION SYSTEM FOR DETECTING ANGLE OF ARRIVAL OF OPTICAL SIGNALS AND A RANGE OF A SOURCE OF THE OPTICAL SIGNALS

CROSS-REFERENCE TO RELATED APPLICATIONS

The present invention claims priority to U.S. Provisional Application No. 61/788,918, filed Mar. 15, 2013, and entitled "ELECTROMAGNETIC RADIATION DETECTING AND WARNING SYSTEM," which is herein incorporated by reference in its entirety.

FIELD

The example embodiments of the present invention relate to an electromagnetic sensor and an optical detection system for detecting and processing optical signals, such as light and laser emissions.

BACKGROUND

Lasers or other forms of coherent electromagnetic radiation (ER) today have numerous applications, such as applications for marking and guiding munitions, vehicles, determining distance (ranging), navigating, surveying, remote sensing, highlighting an object and so on. In response, laser warning receiver (LWR) systems have become important to detect and process laser emissions. Typically, a LWR is a passive system that detects incoming laser emissions and processes the incoming laser emissions for various parameters, such as range of the origin or source of the laser emissions to the LWR system, angle of arrival of the laser emissions, spectral content, etc. For example, it is common for military vehicles, such as planes, helicopters, ships, etc., to be equipped with a LWR system. LWR systems may also be used in civilian or commercial settings, such as for vehicle safety, mass transit, etc.

Currently, the known LWR's are limited in sensitivity, range, spectral coverage (e.g., range of wavelengths detectible by the LWR system), angular coverage, operating temperature, resolution, etc. Moreover, current LWR devices are large and/or bulky and consume large amounts of power. This makes the known LWR systems unsuitable for many applications in which they would otherwise be useful. Furthermore, the known LWR's are prone to false alarms due to ambient light and/or other sources of optical emissions, which are common in the environment.

Accordingly, there is a need for a wideband laser sensing system, which has high optical sensitivities (low optical input) and that are relatively immune to false alarms.

SUMMARY

An example embodiment of the present invention is directed to an electromagnetic sensor of an optical detection system. The system includes a Fresnel lens, and an array of photodetectors having a pixel pitch from about 150 µm to 210 µm enabling an angular coverage of up to 360°, with the Fresnel lens coupled at an aperture of the array and adapted to collect incident optical signals and focus same onto the array, and the array adapted to convert the optical signals into electrical outputs. The electrical outputs are analyzed by the optical detection system to determine, for each optical signal, an incident angle of arrival thereof, a range of a source of the optical signal to the sensor that is determined from the calculated angle of arrival, the electrical outputs further analyzed to minimize a false alarm rate by discriminating each optical signal spectrally to calculate a wavelength thereof, so as to distinguish whether an incident optical signal is from a narrowband laser source operating at a single wavelength or from a broadband light source operating at a continuum of wavelengths.

Another example embodiment is directed to an optical detection system that includes an optical package, a two dimensional (2D) detector array of photodetectors having a pixel pitch from about 150 µm to 210 µm enabling an angular coverage of up to 360°, the 2D detector array coupled to the optical package, and a processor coupled to the array. The optical package is adapted to collect incident optical signals and focus same onto the 2D detector array, and the 2D detector array is adapted to convert the optical signals into electrical outputs. The processor is adapted to analyze the electrical outputs and determine, for each optical signal, an incident angle of arrival thereof and a range of a source of the optical signal to the sensor based on the angle of arrival determination, wherein Fresnel equations are employed to determine the angle of arrival and range.

Another example embodiment is directed to a laser warning receiver (LWR) adapted to detect an optical signal incident from a hostile source. The LWR includes a sensor adapted to collect the incident optical signal, the sensor including a detector array of photodetectors having a pixel pitch from about 150 µm to 210 µm enabling an angular coverage of up to 360°, the detector array adapted to convert the collected incident optical signal into a photocurrent for output from the sensor, a sensor interface coupled to the sensor and adapted to convert the photocurrent into output voltages and signals for analysis, and a processor coupled to the sensor interface. The processor is adapted to iterate algorithms using the output voltages and signals to calculate an incident angle of arrival for the incident optical signal and a range of the hostile source of the optical signal to the LWR based on the angle of arrival calculation, the processor further configured to discriminate the optical signal spectrally to calculate wavelengths thereof for false alarm rejection.

BRIEF DESCRIPTION OF THE DRAWINGS

Throughout the drawings, reference numbers may be re-used to indicate correspondence between referenced elements. The drawings are provided to illustrate example embodiments described herein and are not intended to limit the scope of the disclosure.

FIGS. 21-30 illustrate the various steps of the fabrication process of FIG. 18.

DESCRIPTION OF THE EMBODIMENTS

In the embodiments, a laser sensing system provides high angular resolution and is sensitive to a low laser powers. The sensing system is sensitive to a wide range of wavelengths, has up to a 360° angular coverage at the aperture of the system, and has high discrimination and angular resolution (e.g., the measure (in degrees or radians) of the system's ability to detect small details of the incident optical signal with high accuracy). In one embodiment, the laser sensing system has a near-zero false alarm rate ((FAR), e.g., the rate representing the time between false alarms with the system activated), nanowatt/cm² optical sensitivity, and high detection probability. In addition, the system has spectral discrimination (e.g., the ability to determine the actual wavelength(s) of an optical signal incoming or incident to the system so as to discriminate a laser emission (narrowband and at a single wavelength) from a light emission (broadband signal with a spread of wavelengths) and high angular resolution.

The system may comprise, among other things, a Fresnel lens, a plurality of avalanche photodetectors (APD) distributed in an array, and a data processor. In some embodiments, the APDs enable detection of low power optical signals, such as from a laser, based on having advantageous gain properties without requiring a high voltage bias.

The data processor may comprise a plurality of subprocessors or subroutines that accepts and applies the data in a plurality of algorithms that provide information on the various parameters of the incoming electromagnetic radiation. The embodiments thus provide an innovative combination of wideband sensitive detectors, an angle of arrival optical interface, algorithms and a design that maximizes detection probability, off-axis sensitivity and angular resolution while minimizing the false alarm rate. The embodiments may detect continuous wave (CW) as well as pulsed laser emissions. Furthermore, the embodiments may be coupled to location and directional systems, such as global positioning systems (GPS) and/or a compass.

Various aspects of the disclosure will now be described with regard to certain examples and embodiments, which are intended to illustrate but not to limit the disclosure.

System Overview

Figure 1:
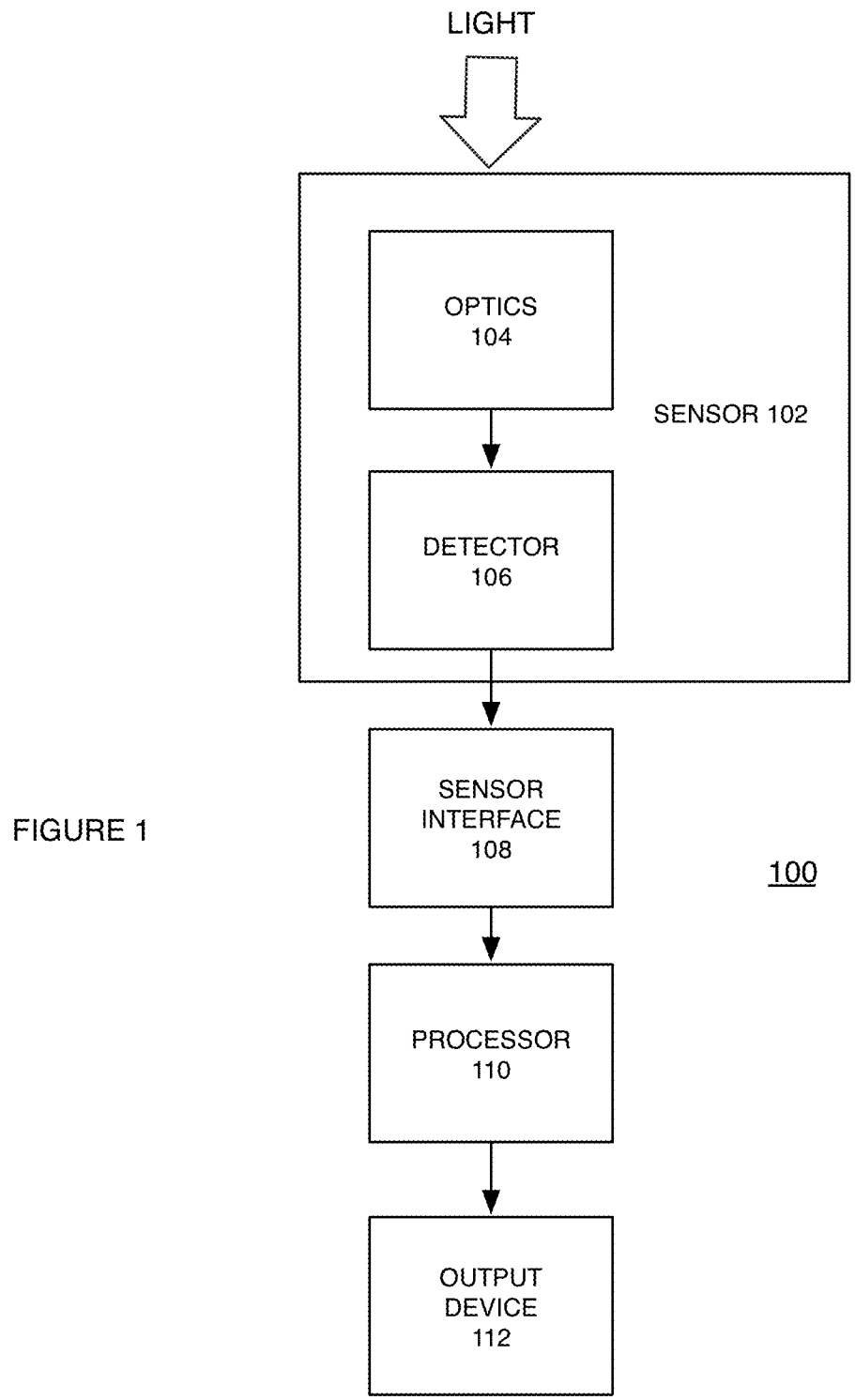
FIG. 1 shows a simplified block diagram of an exemplary system that is in accordance with the principles of the present invention.

FIG. 1 shows a simplified block diagram of an exemplary system that is in accordance with the principles of the present invention. In general, the system 100 may be deployed in numerous types of application. For example, the system 100 may be used as a laser warning receiver (LWR) system to detect a laser emission, e.g., from a threat or hostile source. LWR systems may be used in various settings, such as military operations, air travel, law enforcement, security, etc. Alternatively, the system 100 may be used in a civilian setting, such as for an automobile or train that uses laser to detect proximity to other vehicles or objects. For purposes of illustration, examples of the system 100 used as a LWR is provided in the present description. However, one skilled in the art will recognize how the embodiments may be implemented in a variety of settings.

Below are some exemplary performance specifications that may be achieved by some embodiments of the present invention. Those skilled in the art will recognize that various embodiments may have a wide range of specifications depending on the desired application and/or use of the system 100.

| Spec Description | |
|---|---|
| Spectral Coverage | 450 nm to 1550 nm |
| Sensitivity | 10 nW/cm² |
| False Alarm Rate | <1 per 1000 hours |
| Angular Coverage | 100° |
| Angular Resolution | 1-2° |
| Size, Power | 3.2 × 3.2 × 2 in (81 × 81 × 51 mm), 3 W |
| Operating Temperature | 0° C. to 60° C. |

As shown, the system 100 may comprise a sensor 102, which further comprises optics 104 and a detector 106, a sensor interface 108, a processor 110, and an optional output device 112. These components will now be further described.

The sensor 102 receives light and laser emissions and provides an output to indicate various parameters about the light and laser emissions. As noted, the sensor may comprise optics 104 and a detector 106.

The optics 104 are responsible for collecting the light and (if present) laser emissions and focusing the light onto the detector 106. In some embodiments, the optics 104 may be an optical package that comprises a lens and/or other types of ports. In one example, the optics 104 may be an optical package that comprises a Fresnel lens and an optical grating. In another example, optics 104 may be an optical package that comprises a doublet Fresnel lens for 2D angle resolving detection (EFL 2.5 mm, FOV)>100° and a transmission grating and cylindrical lens (FL 5 mm, FOV)>100° focused on a one-dimensional linear array (1D array) for optical false alarm rejection.

The detector 106 is responsible for converting the light energy and received laser emissions into an electrical output. In one embodiment, the detector 106 may comprise an array of avalanche photodiodes (APDs) that are sensitive to various forms of light and laser emissions. In some embodiments, the APDs are fabricated such that they have a relatively high gain at a modest voltage bias, e.g., 10-50 volts. For example, the APDs used in the detector 106 may have an average breakdown voltage of about 35 volts, a dark current of less than about 100 nA, and optical gain averaging of 10-15 A/W.

As will be described further below, the detector 106 may comprise multiple arrays of detectors to discriminate laser emissions and minimize/avoid false alarms. For example, the detector 106 may comprise a two dimensional (2D) array of APDs that form individual pixels and a one dimensional array (1D) array of APDs.

The angular coverage at the aperture of the 2D array depends directly on the pixel pitch, the number of pixels of the APD arrays and the optical configuration of the sensor 102. In an embodiment, the aperture of detector 106 in sensor 102 of system 100 has up to a 360° angular coverage. In this embodiment, the APD array layout may range from about 50-um pixel diameter and a pitch that ranges from about 150-um to 210-um pitch.

The sensor interface 108 is responsible for acquiring the signals from the detector 106 and converting them into useful output voltages and signals for analysis by the processor. In some embodiments, the sensor interface 108 comprises a readout integrated circuit (ROIC).

The processor 110 is responsible for analyzing the output of the sensor interface 108 and determining various parameters, such as angle of arrival of laser emissions, spectral content, range to source of laser emissions, etc. In one embodiment, processor 110 comprises a field programmable array (FPGA) module to process the detector data. For example, the processor 110 may be implemented based on an Opal Kelly XEM6010 Spartan-6 FPGA module. Alternatively, the processor 110 may be a microprocessor, such as a Rabbit Core RCM3400 microprocessor. One skilled in the art will recognize that various types of processors may be used in the embodiments.

The processor 110 may execute various algorithms and processes using executable program code and software. Data processing algorithms for detection and false alarm rejection and angle are further described below.

The processor 110 may also execute a software interface through a communications interface, such as a RS-485 connector, a wireless network, etc. In some embodiments, processor 110 may execute software for detection and alarm declaration with or without real time data storage, for example, onto a storage card or other medium. The processor 110 may also be provided with GPS connectivity.

The output device 112 is an optional device of system 100 so that a user can interface with the system 100. For example, the output device 112 may be a speaker or display, a computer, a laptop, or other form of user interface device. The output device 112 may also comprise an interface to other computing systems, such as one or more communications ports or an application programming interface.

In one embodiment, the output device 112 is adaptable to various systems. For example, the output device 112 may employ one or more standard communications protocols, such as RS-485, as an output interface. The output device 112 may thus provide information about the threat and periodic system status updates.

Figure 2:
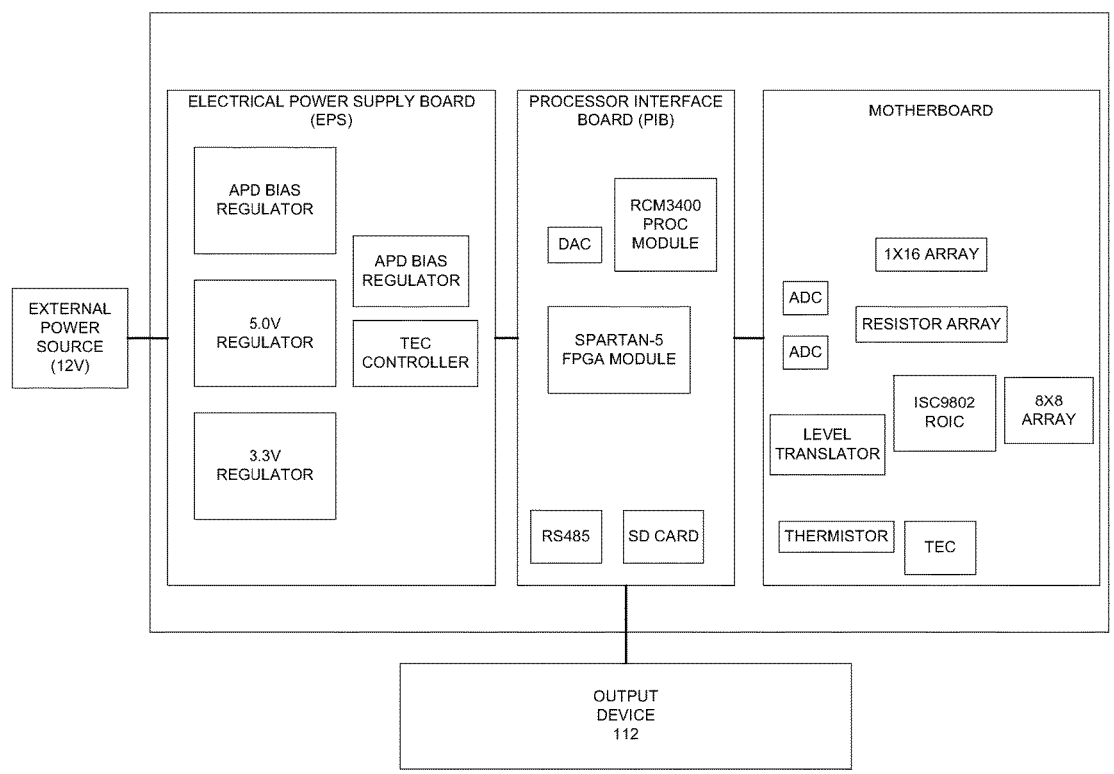
FIG. 2 shows a more detailed block diagram of one embodiment.
Figure 3:
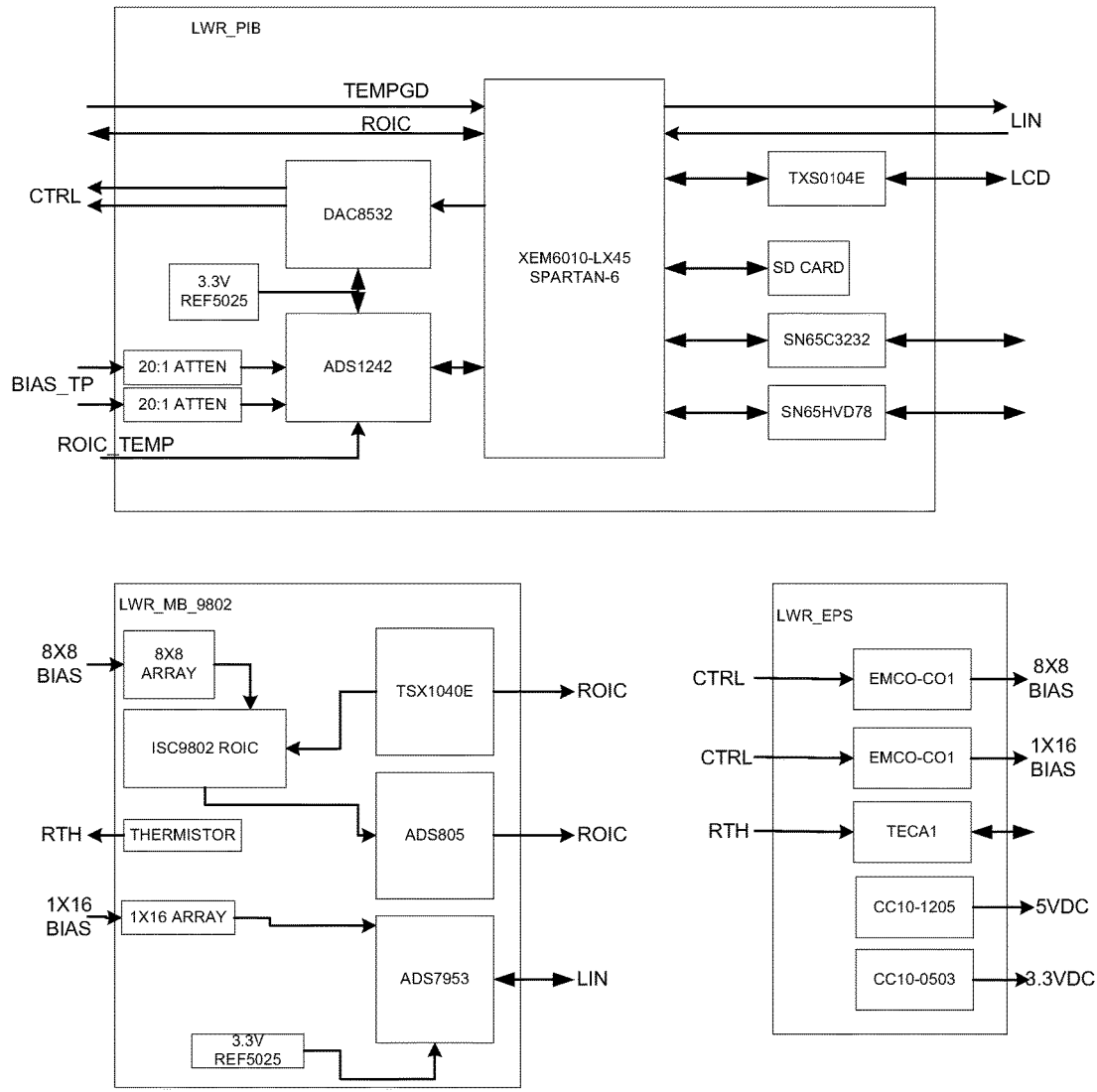
FIG. 3 shows an exemplary embodiment of the present invention with a readout circuit (ROIC).

FIG. 2 shows a more detailed block diagram of one embodiment and FIG. 3 shows an exemplary implementation of the block diagram shown in FIG. 2. The electrical power system board (EPS) regulates power to all components in the system. As shown, the EPS may comprise an APD bias regulator, a 5.0 volt regulator, and a 3.3 volt regulator. The processor interface board (FIB) implements the digital control logic and signal processing. As shown, the PIB may comprise a digital to analog converter (DAC), a processor module (such as a RCM 3400 microprocessor), a FPGA processor, an interface (such as a RS-485 interface), and a memory (such as a SD card). The motherboard (MIB) is a single board with ground plane to hold detectors and analog to digital conversion chips. As shown, the MIB may comprise a 1D array, a resistor array, a ROIC, a 2D array (of 8×8 pixels of APDs), a level translator, a thermistor, and TEC.

FIG. 3 illustrates the arrangement of the detector boards, motherboard, power board, LWR optics and the output interface. In this embodiment, the detector board contains the APD array for detector 106 and sensor interface 108 as a ROIC, a motherboard containing the detector board and the processing and interface electronics. As also shown, the power components, such as bias regulators and power drivers, are located on a separate board, for example, to reduce noise in system 100.

As shown, the motherboard includes the detector board, a thermoelectric cooler (TEC), a TEC driver and a thermistor for temperature stabilization of the LWR.

In one embodiment, the control and data processing components may employ an FPGA. For example, the Spartan-6 FPGA may be used to control the onboard chips (MUX, ADC, DAC, ROIC, RS485) and for processing the detector outputs and running the detection algorithms. Alternatively, a microprocessor may be used for onboard chip control and signal processing.

ROIC and Resistive Load Interfaces to Detector Array

In some embodiments, the detector interface may use an ROIC as a sensor interface for the 2D detector array. In this embodiment, the ROIC may accommodate the different types of laser systems and false alarms by employing a smart periphery, which encloses the receiver's homogeneous array of common pixel cells. The smart periphery may comprise heterogeneous cells capable of making decisions at faster rates than the homogeneous array. The smart periphery cells are designed to detect the widest variety of laser threats, spectral discrimination for false alarm detection and to program the array based upon these results. In some embodiments, the contents of the cell may comprise: a LNA (low noise amplifier), the integrator stage, ADC (analog to digital converter) and capacitors.

Figure 4:
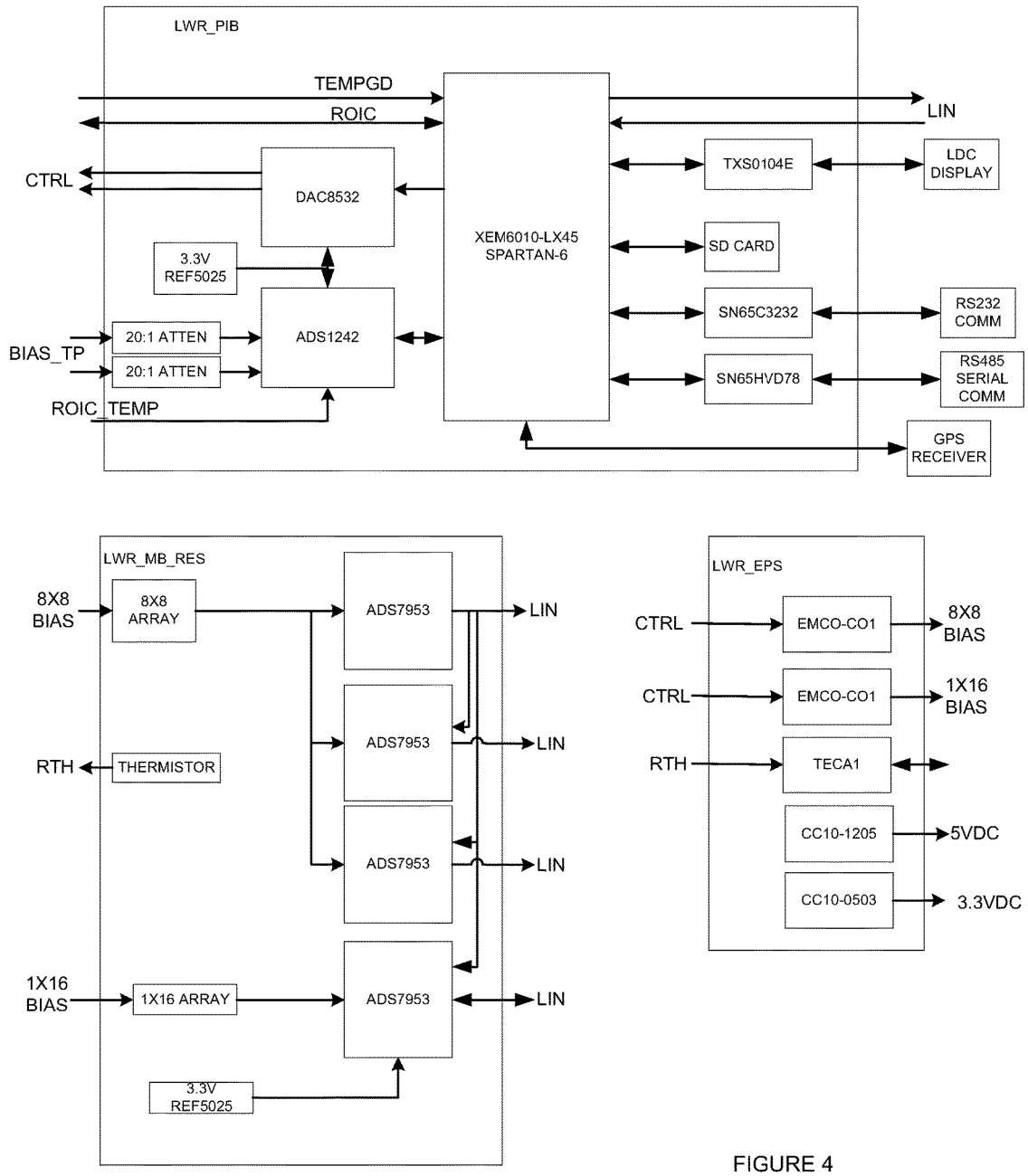
FIG. 4 shows an alternative embodiment that employs resistive load circuit interfaces in accordance with the principles of the present invention.
Figure 5:
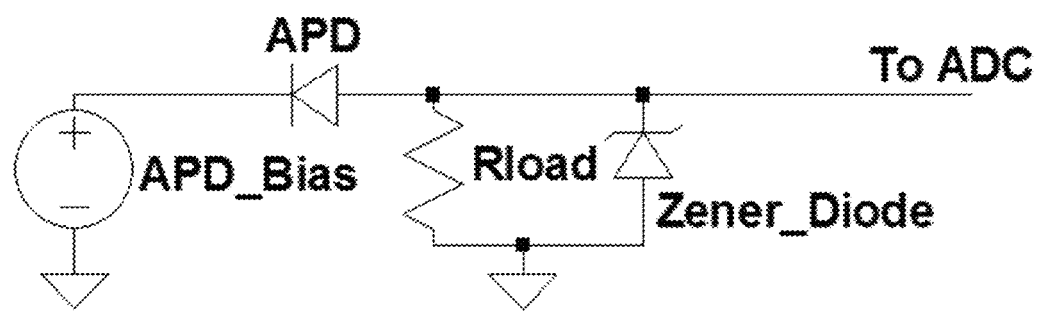
FIG. 5 shows an exemplary resistive load circuit interface that may be employed in some embodiments to allow damaged pixels to be shorted out.

FIG. 4 shows an alternative embodiment that employs resistive load circuit interfaces in accordance with the principles of the present invention that may be used to break the connection of an APD pixel if that pixel becomes defective. FIG. 5 shows an exemplary resistive load circuit interface that may be employed in some embodiments.

In particular, resistors may be used in the sensor interface 108 to convert the photocurrent from the detector 106 into output voltages. This alternate approach may have better noise performance and speed.

In this embodiment, all APD outputs from the detector 106 feed through a resistive load circuit (shown in FIG. 5) to convert optical current to voltage. Analog multiplexors may be used to switch between the detector outputs and connect to the ADCs on the motherboard.

Exemplary Sensor

Figure 6:
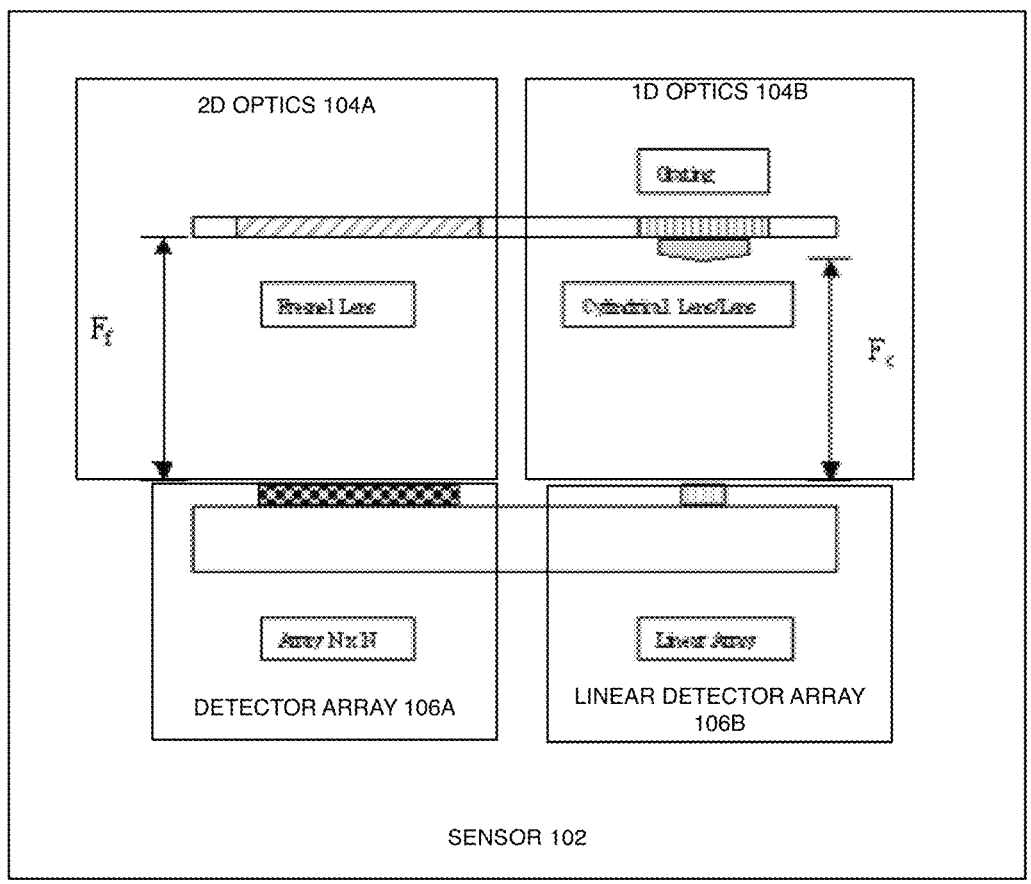
FIG. 6 shows a more detailed block diagram of an exemplary sensor with the optical arrangement of the detection scheme.

FIG. 6 shows a more detailed block diagram of an exemplary sensor 102. In this embodiment, the sensor 102 comprises an ultrasensitive wavelength dispersive photoreceiver array operating in the 450-1550 nm wavelength range. In some embodiments, the array(s) of sensor 102 can operate in a wavelength range between about 200 nm to 3000 nm. The photoreceiver array consists of specialized optics (2D optics 104A and 1D optics 104B) and the APD array (see 2D detector array 106A and linear 1D detector array 106B), and the sensor electrical interface 108 (not shown) is a read out integrated circuit (ROIC).

Angle of arrival detection is accomplished by using a Fresnel lens in optics 104A to focus incoming signals onto a pixel on an 8 by 8 APD detector array 106A. The angular discrimination can be determined by the pixel detecting the focused optical signal or the algorithms can be used to determine the angle of arrival.

Spectral discrimination and false alarm rejection is accomplished by using a transmission grating as part of 1D optics 104B and a cylindrical lens over a linear 1 by 16 APD detector array 106B ("1D detector array 106B") and is used by the algorithms for false alarm rejection.

2D Optics and Detector Array

Figure 7:
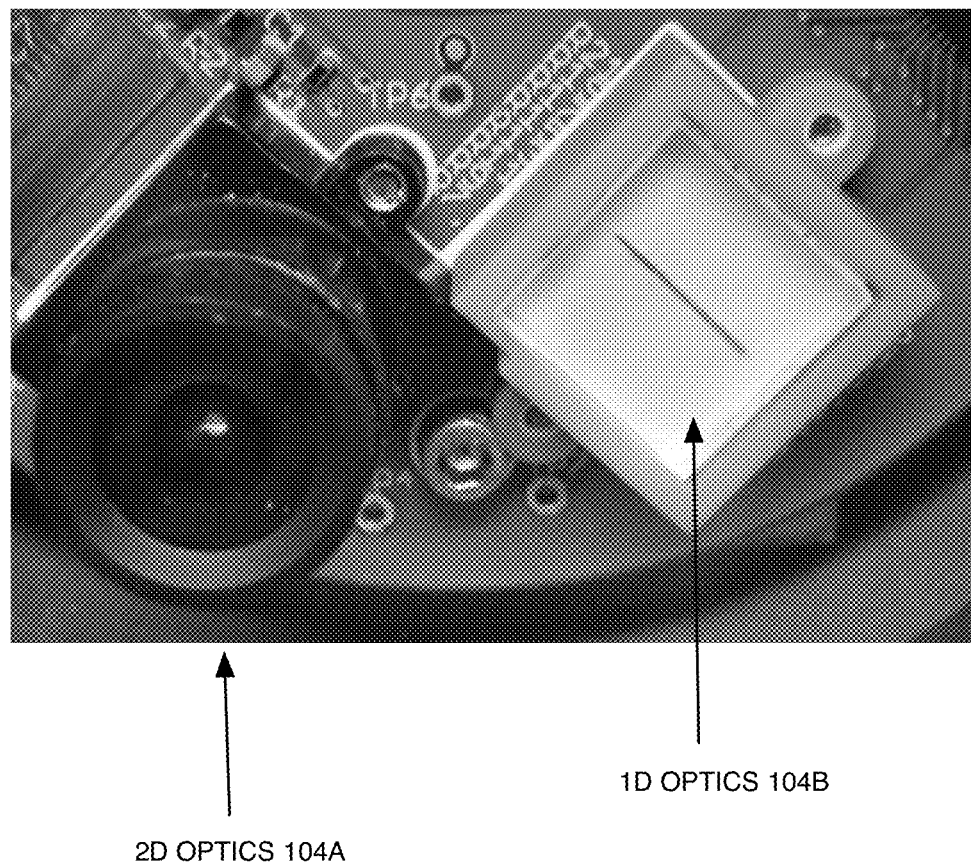
FIG. 7 shows an image of some exemplary optics that may be employed in the sensor.

FIG. 7 shows an image of some exemplary optics that may be employed in the sensor. As shown, the optics 104 may comprise a Fresnel lens as optics 104A and a transmission grating as optics 104B.

Alternatively, in some embodiments, the optics may comprise a single aperture and routing design that routes some of the incoming optical signal to a 2D array and another portion of the signal to a 1D array. This routing may be accomplished by using various configurations of one or more lenses and pathways for the light.

Figure 8:
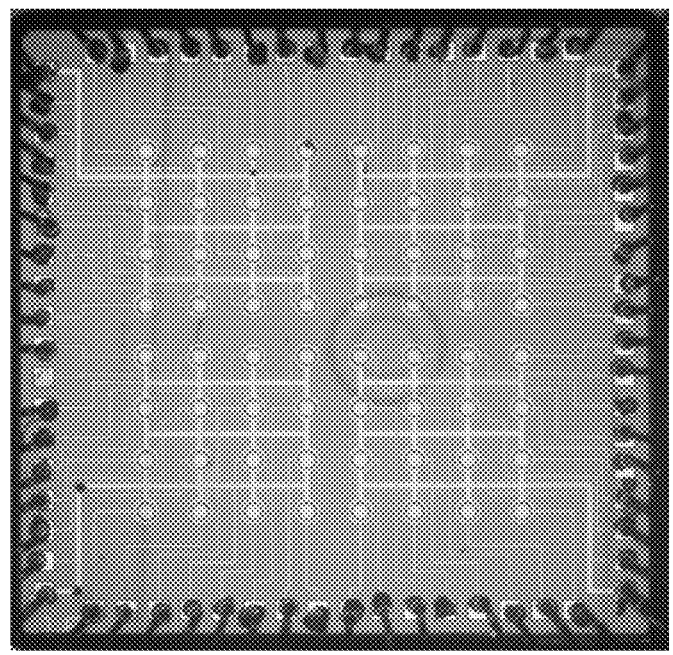
FIG. 8 shows an exemplary 2D detector array and ROIC that may be employed in some embodiments.

FIG. 8 shows an image of an exemplary 2D array and related circuitry.

Determining Angle of Attack of a Laser Emission

Figure 9:
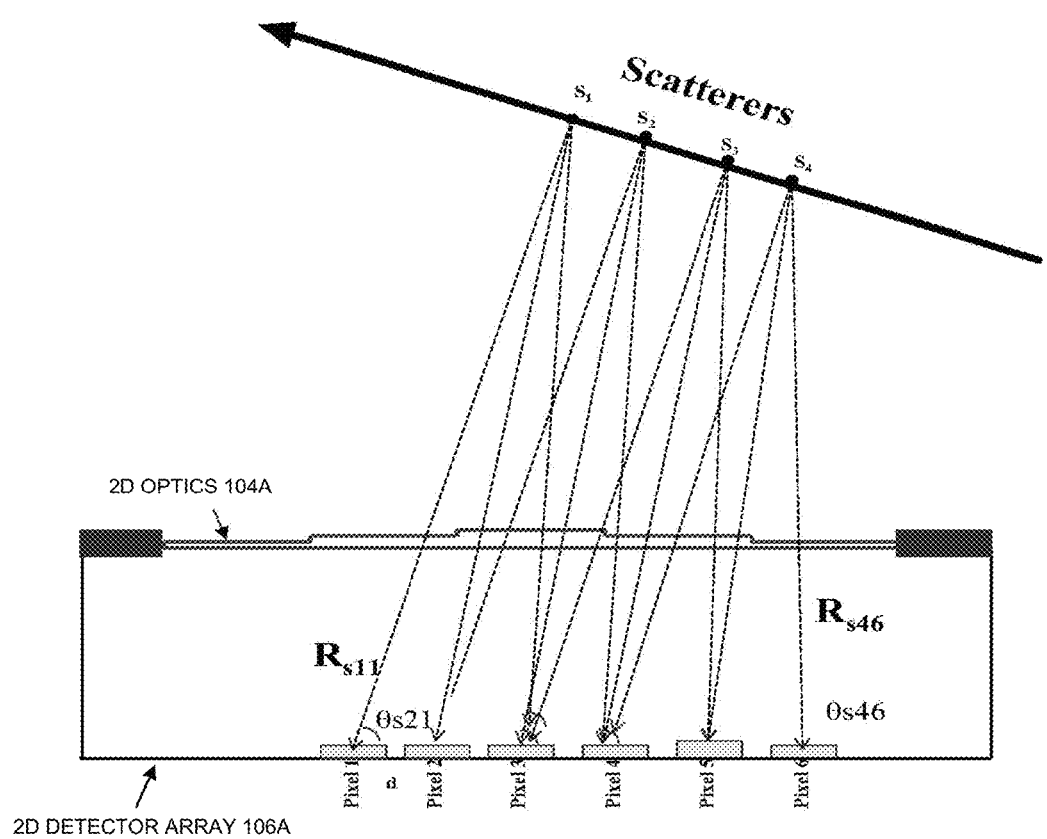
FIG. 9 conceptually illustrates how laser emissions and its angle of arrival are captured by the 2D detector array in a sensor of the embodiments.

FIG. 9 conceptually illustrates how laser emissions and its angle of arrival are captured by the 2D detector array 106A of sensor 102. A threat laser or optical signal is incident on the LWR system 100 or is caused to be incident by atmospheric scattering on the aperture of the detector array 106A. The incident optical signal is transmitted through the Fresnel lens of 2D optics 104A on to the detector array 106A.

Angular information is embedded in the detected optical and photocurrent signal. An angular discrimination algorithm is then used to determine the angle of arrival.

The angle of arrival can be determined from the relative intensity of all the pixels in the detector array 106A. The technique is based on the known non-coherent Fresnel finding technique. In particular, the Fresnel lens located at the aperture of detector array 106A causes the transmittance of the radiation to vary continuously as a function of the incident angle. The intensity at each pixel in the detector array 106A is thus a function of the angle of each pixel relative to the emission source, and the range and the resolution is a function of the relative intensity distribution over the image formed by the pixels in the detector array 106A.

The measured relative intensities at each pixel provide enough information for range determine using algorithms and by electronic signal processing of the pixel photocurrent data.

The angle of arrival (angle Theta) can be calculated using the angle dependent Fresnel transmission curves, which can be correlated to the photocurrent signals I generated by each pixel of the detector array using the following equations:

$$\theta_1 = f\left[\frac{I_1}{I_1 + I_2}\right] \quad \theta_2 = f\left[\frac{I_2}{I_1 + I_2}\right] \quad \theta = f\left[\frac{I_1 - I_2}{I_1 + I_2}\right]$$

In addition, the range of the origin or source of the laser to system 100 may be calculated based on the following equation:

$$R = \frac{d}{2\cos\theta_2}\left[\frac{\sin^2\theta_2 - \sin^2\theta_1}{\sin^2(\theta_2 - \sin^2\theta_1)}\right] - 1$$

Angular Determination Algorithm

Figure 10:
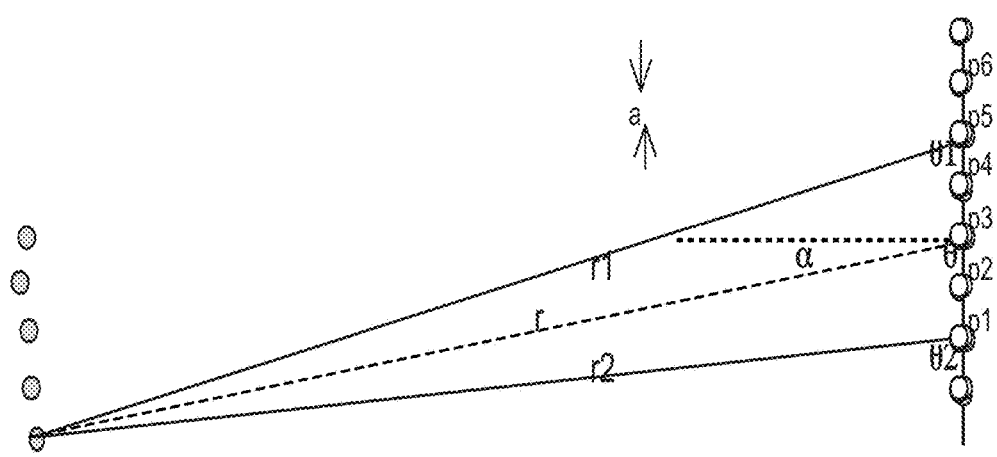
FIG. 10 illustrates an algorithm for angular determination of an optical signal, such as a laser, using the 2D array in a sensor of the embodiments.

FIG. 10 shows how the angle of arrival and range of an optical signal source or other type of electromagnetic radiation may be determined. As noted, the embodiments may implement various algorithms for determining the incident angle of an optical signal, such as a laser emission. These non-linear equations can be solved using non-linear equation solvers that may be programmed into FPGAs or as a microprocessor firmware, or software as part of processor 110. In general, the angular recognition algorithm comprises: measuring photocurrents of pixels received by the sensor; calculating photocurrent ratios; solving the nonlinear equations to determine an angle of arrival of the optical signal; and using the angle of arrival to determine a distance of the optical signal.

One example of an implementation of the algorithm will now be described with reference to determining the angle and distance of an optical signal, such as a laser. As shown in FIG. 10, an exemplary embodiment of system 100 as a LWR optical configuration is illustrated. In FIG. 10, the dots (on the left) represent the laser at different angular positions relative to the pixels, which are numbered p1 to p6, for example.

The distance between the laser and the LWR at any arbitrary angular position, $r_i$, and the photocurrent at each pixel, $i_{phi}$, can be expressed by the classical range equation and the Fresnel equation as follow:

$$r_i = \frac{a}{2}\left[\frac{\sin\theta_i}{\sin(\theta - \theta_i)}\right] = \sqrt{\frac{G}{i_{phi}}}\, e^{-\beta r_i} \quad 1$$

$$r_i = \frac{a}{2\cos\theta_{i+1}}\left[\frac{\sin^2\theta_{i+1} - \sin^2\theta_i}{\sin^2(\theta_{i+1} - \sin^2\theta_i)}\right] - 1 \quad 2$$

$$i_{phi} = \frac{4G}{d^2}\left[\frac{\sin^2(\theta - \theta_i)}{\sin^2\theta}\right] e^{-2\beta r_i} \quad 3$$

where $\theta_i$ is the angle of incidence on pixel $p_i$, $\theta$ is the angle subtended between the source and the midpoint between pixels $p_i$ and $p_{i+1}$. G is the constant in the range equation which accounts for the detector performance and other physical constants, d is the spacing between the pixels and b is the optical attenuation coefficient.

The intensity ratio at each pixel can then be expressed as:

$$\frac{i_{phi}}{i_{ph1} + i_{ph2} + \ldots + i_{phi}} = \quad 4$$

-continued $$\frac{\left[\frac{\sin^2(\theta-\theta_i)}{\sin^2\theta}\right]}{\left[\frac{\sin^2(\theta-\theta_1)}{\sin^2\theta}\right]+\left[\frac{\sin^2(\theta_2-\theta)}{\sin^2\theta_2}\right]+\ldots+\left[\frac{\sin^2(\theta_i-\theta)}{\sin^2\theta_i}\right]}$$

Equation 4 can be used to generate i non-linear equations with i variables and the intensity ratios are based on the measured photocurrent data at each pixel. Any other type of non-linear equations can be formulated based on any functions or transform of the photocurrent data. The most obvious of these is the intensity ratio, which has the advantage of normalizing the data to eliminate systematic anomalies.

Figure 11:
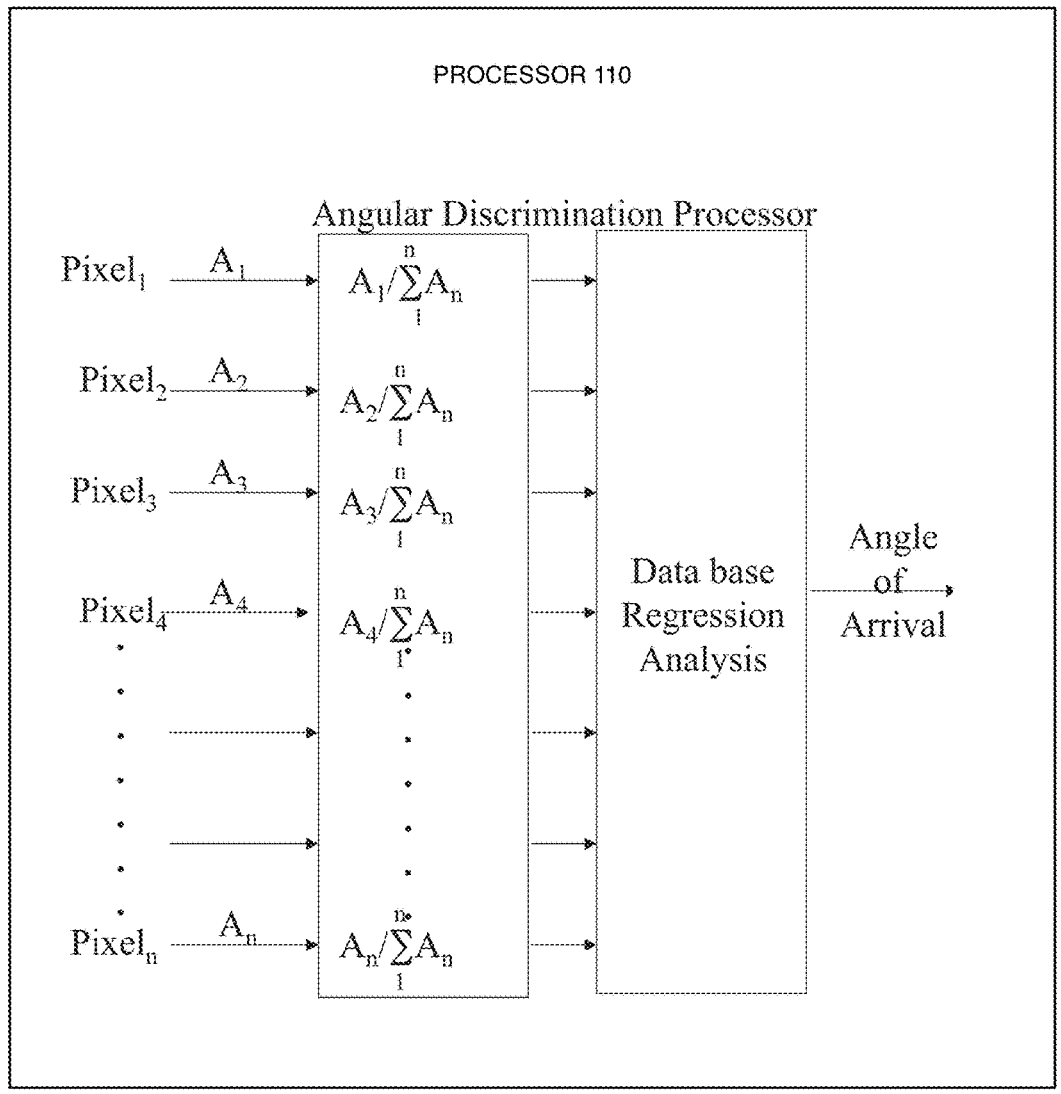
FIG. 11 shows one example of how data from the 2D detector may be processed by a processor in a system to determine angular information of laser emissions in accordance with the principles of the present invention.

FIG. 11 shows one example of how data from the detector 106 may be processed to determine angular information of laser emissions in accordance with the principles of the present invention. As shown, the processor 110 may comprise an angular discrimination processor, which interprets the embedded angular information provided by the detector 106. In this embodiment, the processor 110 employs a database regression analysis to then determine the angle of arrival, for example, using a lookup table described below. The processor 110 may execute various routines and subroutines based on program code, such as VHDL, and C++ to perform the angle of arrival determination and range determination algorithms of the equations described above.

Alternative Embodiment for Angular Discrimination

Alternatively, the system 100 may determine the angular parameters based on a calibration procedure, which is stored as a data structure in a memory or storage within system 100. In particular, the system 100 may be calibrated by measuring photocurrent data as a function of a known angle of arrival for various calibration signals. This data may reside in a database or memory of the system, and may be entered and updated from time to time. The variations shown can be used to determine the angle of arrival from the peak positions at each pixel. The angular coverage depends on the number of pixels and the pixel pitch. The angular resolution depends on the pixel pitch.

Exemplary Lookup Table

| Pixel # | Incident Angle Azimuth | Incident Angle Elevation | Measured/Incident Angle Different (+/−) Azimuth | Measured/Incident Angle Difference (+/−) Elevation |
|---|---|---|---|---|
| 1 | 7 | 45 | 2 | 7 |
| 2 | 0 | 30 | 2 | 6 |
| 3 | −14 | 57 | 4 | 8 |
| ... | | | | |
| n | | | | |

False Alarm Rejection Using a 1D Detector Array and Optics

Figure 12:
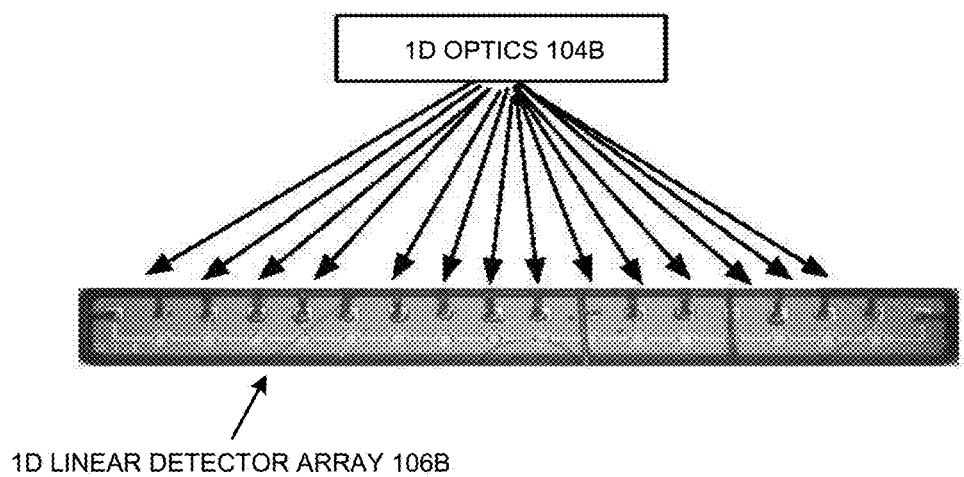
FIG. 12 shows exemplary 1D detector arrays that may be used in some embodiments.

FIG. 12 shows exemplary 1D detector arrays that may be used in some embodiments. In one embodiment, the 1D detector array 106B may comprise a linear 1×16 array of APDs. The 1×16 linear arrays may be designed to detect and discriminate optical signal spectrally dispersed by transmission gratings for wavelength discrimination and false alarm rejection. A resistive load or an ROIC may be used to convert the optical currents of the 1×16 linear array to voltages and to send the 16 pixel data to the sensor interface 108 in parallel.

Figure 13:
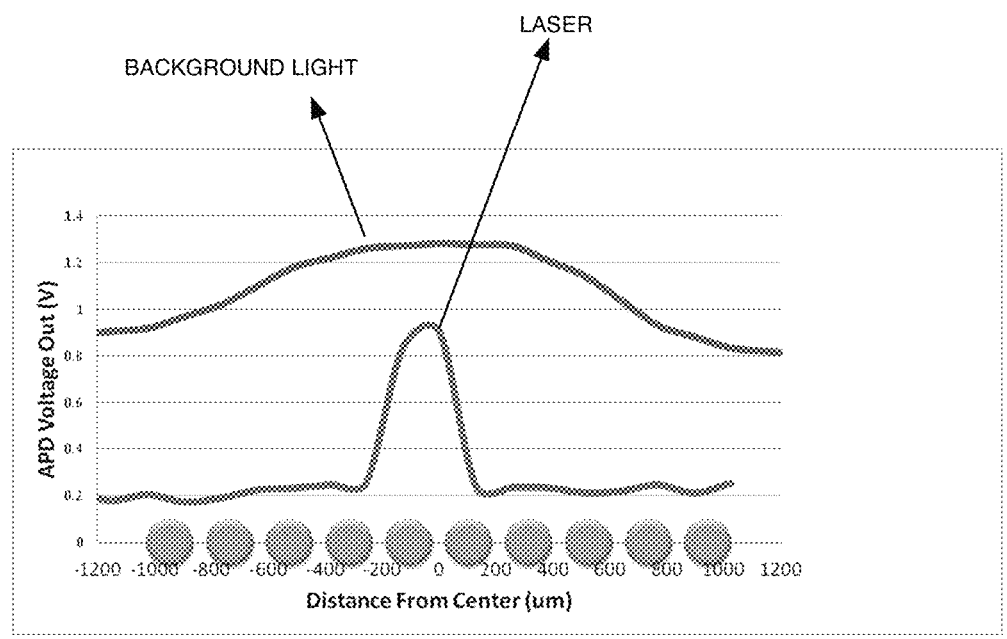
FIG. 13 conceptually illustrates how laser emissions are distinguished from other types of optical information by a 1D detector array of the embodiments.
Figure 14:
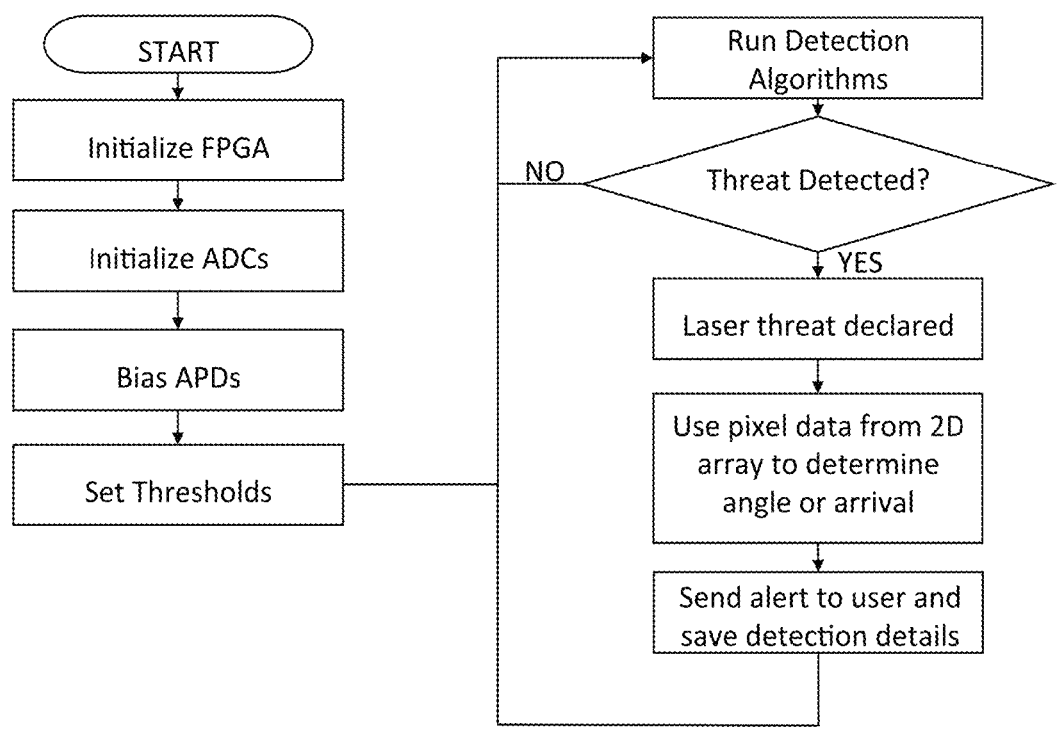
FIG. 14 shows an exemplary general process flow in accordance with the principles of the present invention.

FIG. 13 conceptually illustrates how laser emissions are distinguished from other types of optical information by the 1D detector array 106B of the embodiments. In particular, the 1D detector array 106B may be used to avoid/minimize false alarms. The false alarm rejection is based on spectral discrimination, pulse repetition frequency (PRF), pulsewidth and threshold detection to unambiguously generate alarms with minimal errors.

As shown, the 1D detector array 106B receives an optical signal from 1D optics 104B, which may be configured as a transmission grating and cylindrical lens focused. As shown, the incoming threat optical signal passes through the grating, which disperses the photons spatially depending on their wavelength. Lasers operating at a single wavelength will only illuminate a small area of the 1D detector array 106B and will therefore be incident at a predetermined pixel depending on the optical design. Broadband light sources, however, have a continuum of wavelengths and thus will be split into individual wavelengths and illuminate many pixels. Using the pixel distribution of photocurrent on the linear array, the LWR electronics of system 100 can determine if the optical signal is coming from a narrowband source and at what wavelength.

The normalization of the output signals allows the range measurement to be independent of the signal level from the target. Therefore, by measuring the photocurrents of the detector array pixels the angles can be calculated.

Exemplary Software Process Flows

Figure 15:
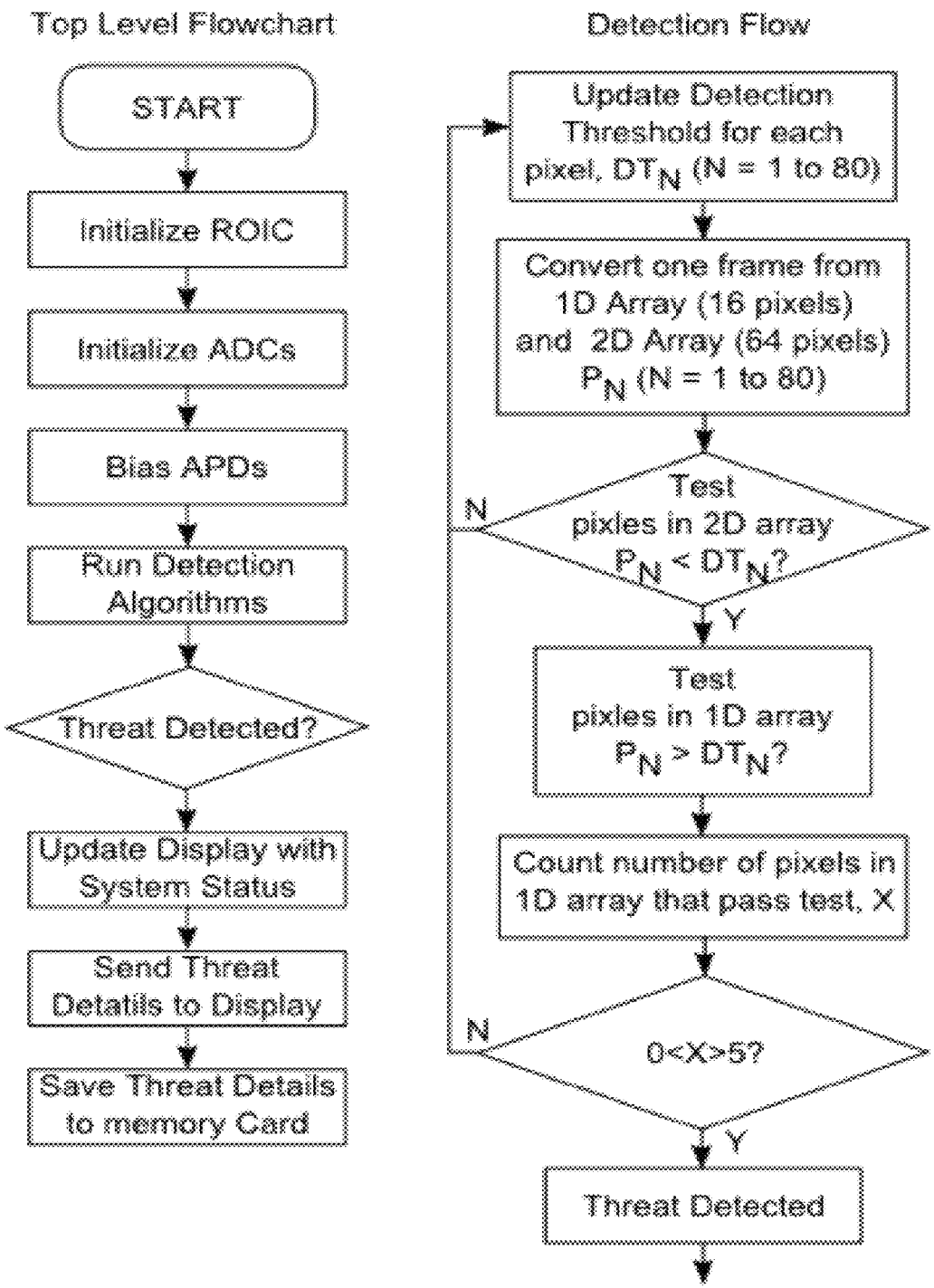
FIG. 15 shows another exemplary process flow in accordance with the principles of the present invention.
Figure 16:
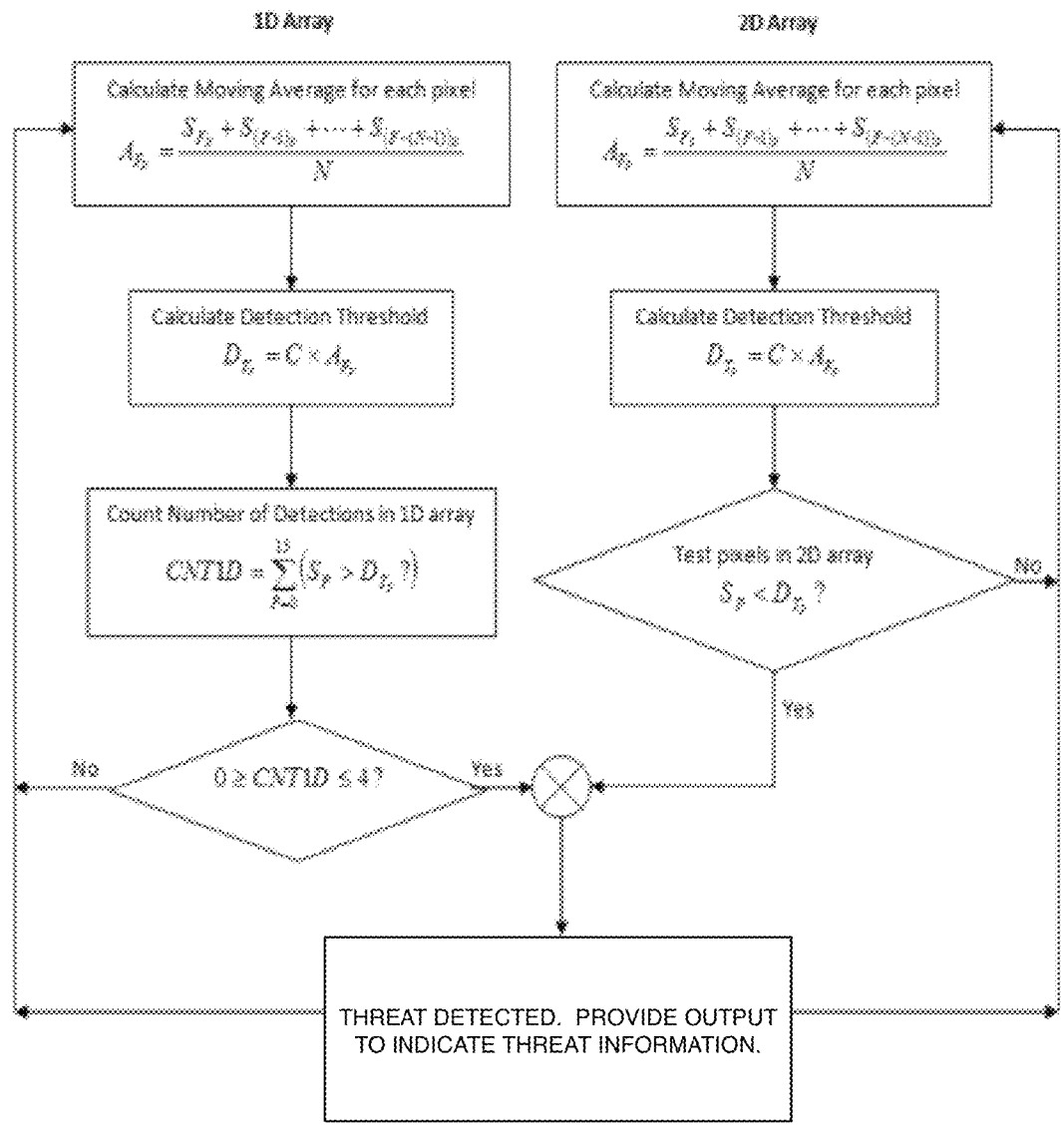
FIG. 16 shows an exemplary process flow for detection of laser emissions.
Figure 17:
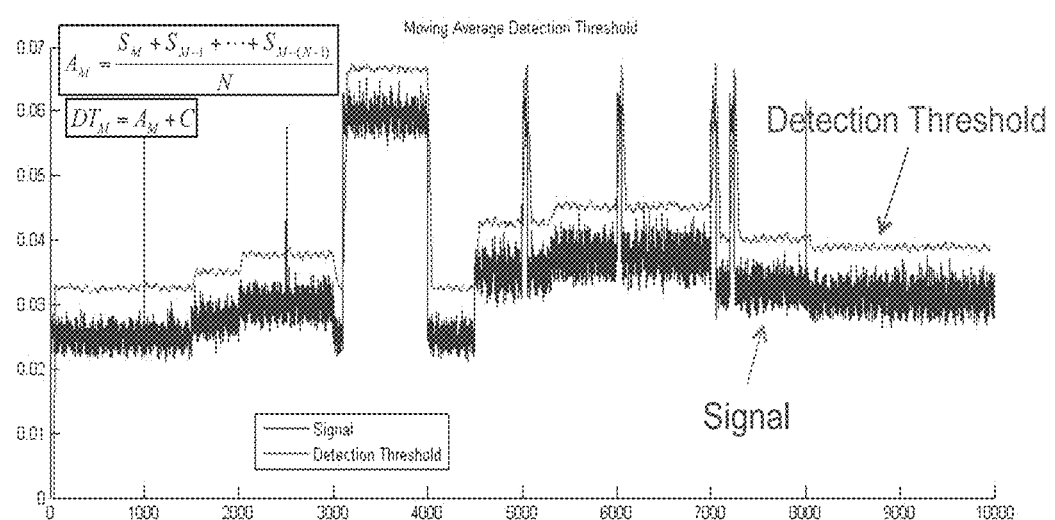
FIG. 17 illustrates the setting of a detection threshold in accordance with an embodiment of the present invention.

FIG. 15 shows an exemplary general process flow for the software in accordance with the principles of the present invention. FIG. 16 shows another exemplary software process flow in accordance with the principles of the present invention. FIG. 17 shows an exemplary software process flow for detection of laser emissions. These process flows may be implemented as software running on the processor 110 using known executable program code language, such as VHDL, C, C++. Those skilled in the art will recognize that any programming language and program code using any number of subroutines, libraries, etc. may be employed in the embodiments. In another embodiment, the spectral signature of the optical signal may be determined. The spectral discrimination feature may be implemented using filters provided at each of the pixels. For example, semiconducting optical amplifiers, such as fabry-perot filters, may be implemented. Any type of filter may be implemented using known techniques.

Alternatively, spectral discrimination may be accomplished using a grating to spatially disperse the optical signal onto an array of pixels designed to correspond to different wavelengths. These spectral discrimination features enable false alarm rejection, threat identification, classification, as well as spectral binning to reduce false alarms and enable the capability for day/night operation.

Detection Threshold

FIG. 17 illustrates how the system 100 sets a detection threshold. The detection threshold analysis is based on concepts and formulas used to characterize bit error rate (BER) in communications, which is equivalent to the false alarm rate (FAR) in detection theory. The FAR is related to the sensitivity, which may be expressed by the following equations:

$$S_{min} = Q*\text{NEP}$$

$$\text{FAR} = \frac{1}{2}[1-\text{erf}(Q/\sqrt{2})] \sim 1/\sqrt{(2p)}[\exp((-Q^2/2))/Q] \qquad 3.2.2$$

$$\text{FAR} \sim \text{NEP}/\sqrt{(2p)}[\exp((-(S_{min}/\text{NEP})^2/2))/S_{min}] \qquad 3.2.3$$

where NEP is the noise equivalent power at which the signal-to-noise ratio (SNR) is 1, Q is the error or false alarm factor which is related to FAR by an error function for generalized noise or a Gaussian function for Gaussian noise. While NEP is the minimum noise power (sensitivity) at SNR=1, Smin is the sensitivity at an SNR designed to produce a particular FAR. These equations were used to estimate the trade-off between FAR and sensitivity. For these estimates, the threshold may be set to yield a probability of detection close to 100%. Accordingly, in the embodiments, a more aggressive or closer detection threshold may be used due to the advantages of the FAR of the embodiments.

Fabrication of the APDs and Detector Array

Figure 18:
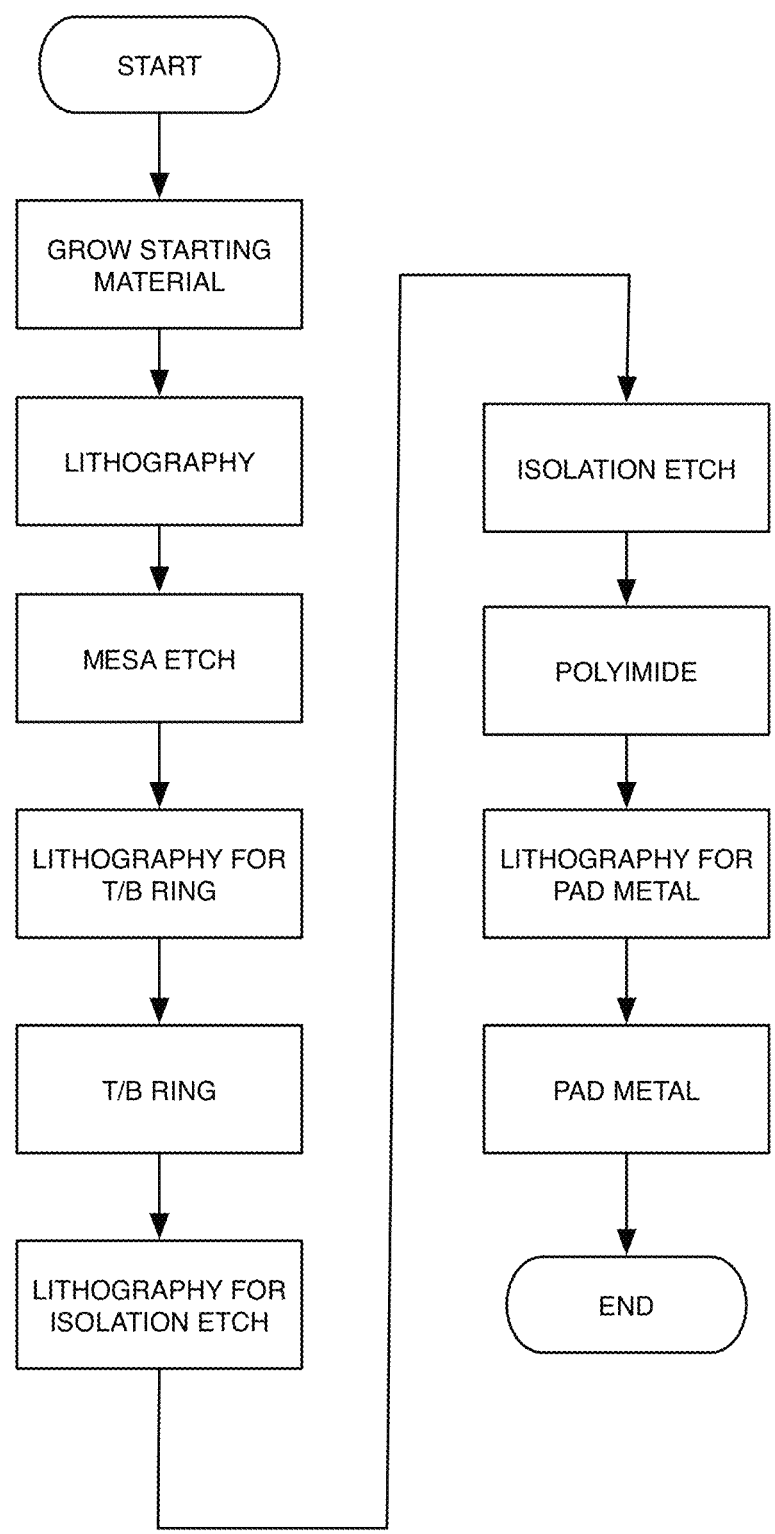
FIG. 18 illustrates an exemplary process flow for fabricating the detector array in accordance with an embodiment of the present invention.

FIG. 18 illustrates an exemplary process flow for fabricating the detector array in accordance with an embodiment of the present invention.

Figure 19:
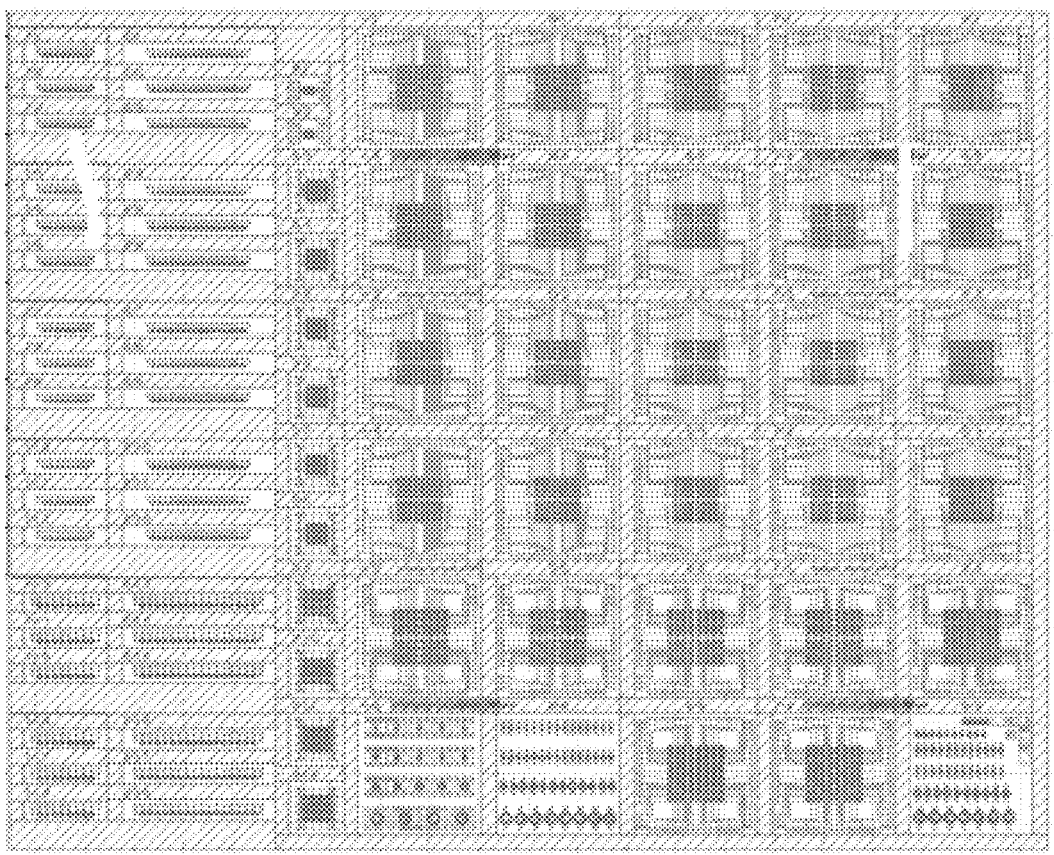
FIG. 19 illustrates an exemplary mask that may be used in the fabrication process for the detector array.
Figure 20:
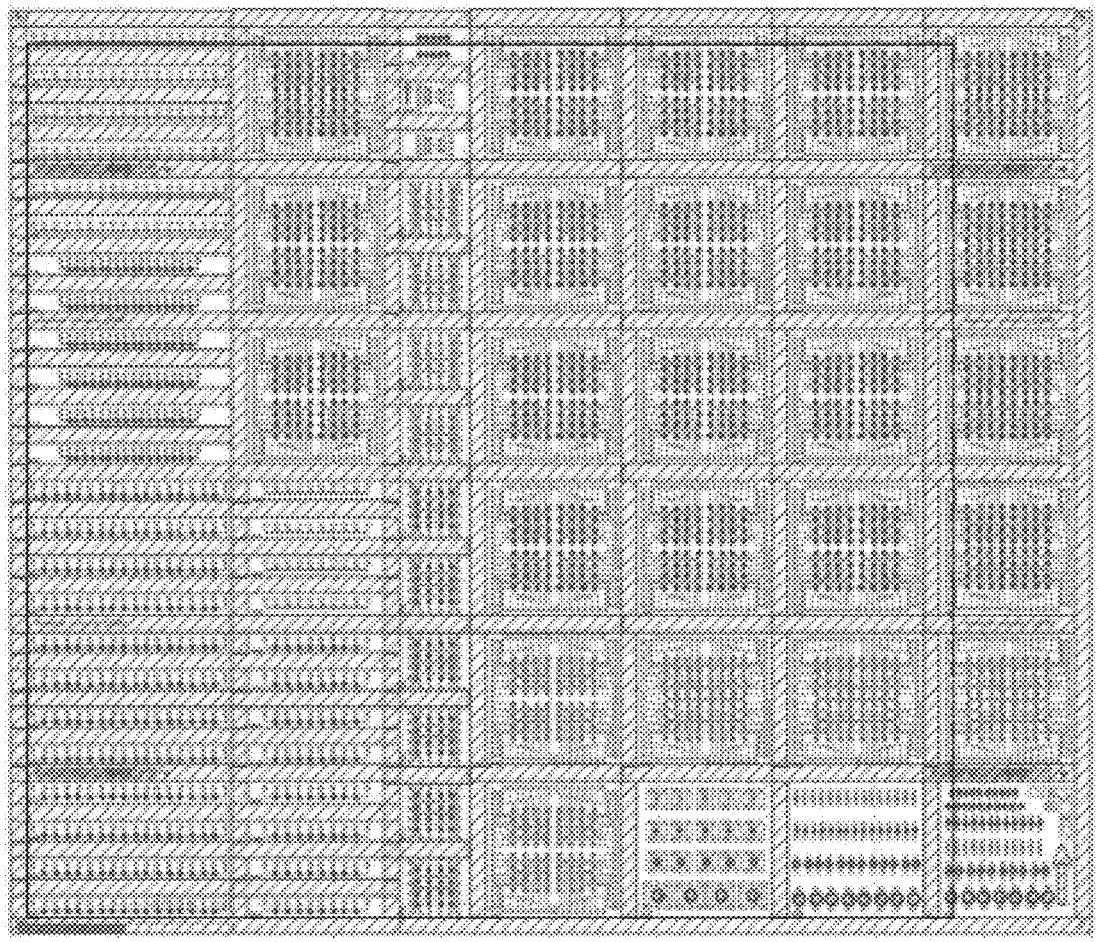
FIG. 20 illustrates another exemplary mask that may be used in the fabrication process for the detector array.

FIG. 19 illustrates an exemplary mask that may be used in the fabrication process for the detector array. FIG. 20 illustrates another exemplary mask that may be used in the fabrication process for the detector array.

In particular, FIGS. 19 and 20 show the layout of a reticle of each mask set. In the first mask set (shown in FIG. 19), each reticle has 27 8×8, 10 4×4 and 2 2×2 APD arrays as well as 18 1×16 and 1×8 linear arrays, with both 30 and 50-um pixel diameters and 150-um pixel spacing. In the second mask set, (shown in FIG. 20), each reticle has 24 8×8, 10 4×4 and 2 2×2 APD arrays as well as 18, 1×16 and 12, 1×8 linear arrays, with both 30 and 50-um pixel diameters and 210-um pixel spacing.

FIGS. 21-30 illustrate the various steps of the fabrication process of FIG. 18. FIG. 21 shows that about 2-2.5 µm, e.g., 2.27 µm of material is initially grown. This material may be grown based on processes known to those skilled in the art.

Next, in FIG. 22, lithography for a mesa etch is performed. This step may comprise: a solvent clean; a spin coat of S1818 photoresist; a softbake @ about 90-100° C., e.g., 95° C.; an expose @~24 mW/cm2; a develop process; and a hardbake @ 100-120° C., e.g., 115° C.

Figure 23:
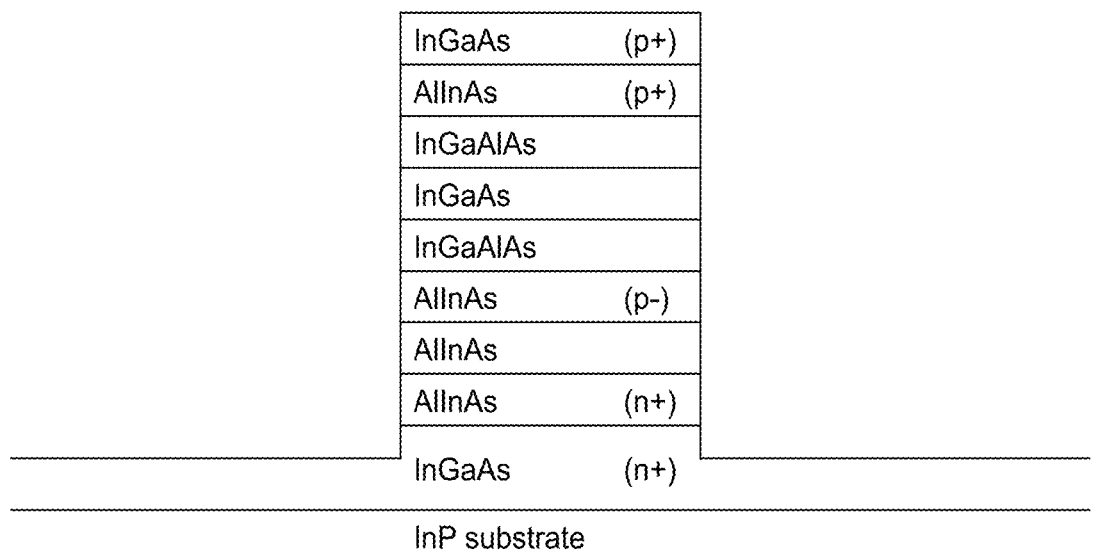
Figure 24:
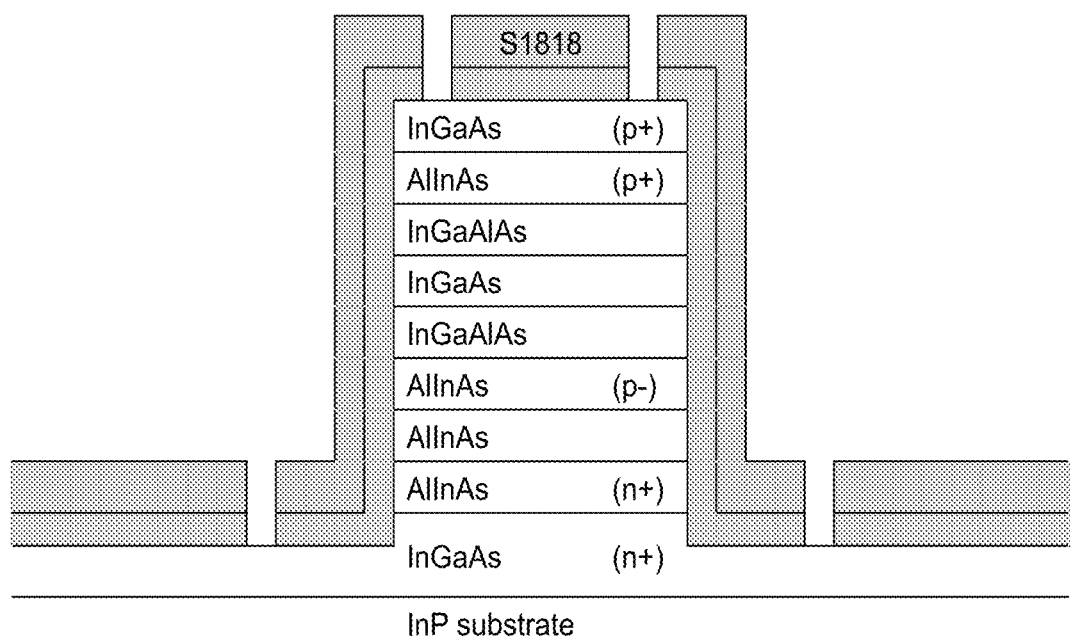

Next, in FIG. 23, a mesa etch is performed. This step may comprise: an etch ~2 µm (~20 mins) using DI H2O:H3PO4:H2O2, 50:1:1 (vol.) and etch ~1000 Å into n+ InGaAs; and a photoresist strip using Acetone→Methanol→DI water w/agitation Next, in FIG. 24, a lithography for a T/B ring is performed. This step may comprise: a solvent clean; a spin coat of LOR 10B; a softbake of the LOR @ about 190-200° C., e.g., 195° C.; a spin coat of S1818 photoresist; a softbake of the photoresist at @ 90-100° C., e.g., 95° C.; an expose @~24 mW/cm2; and a develop process.

Figure 25:
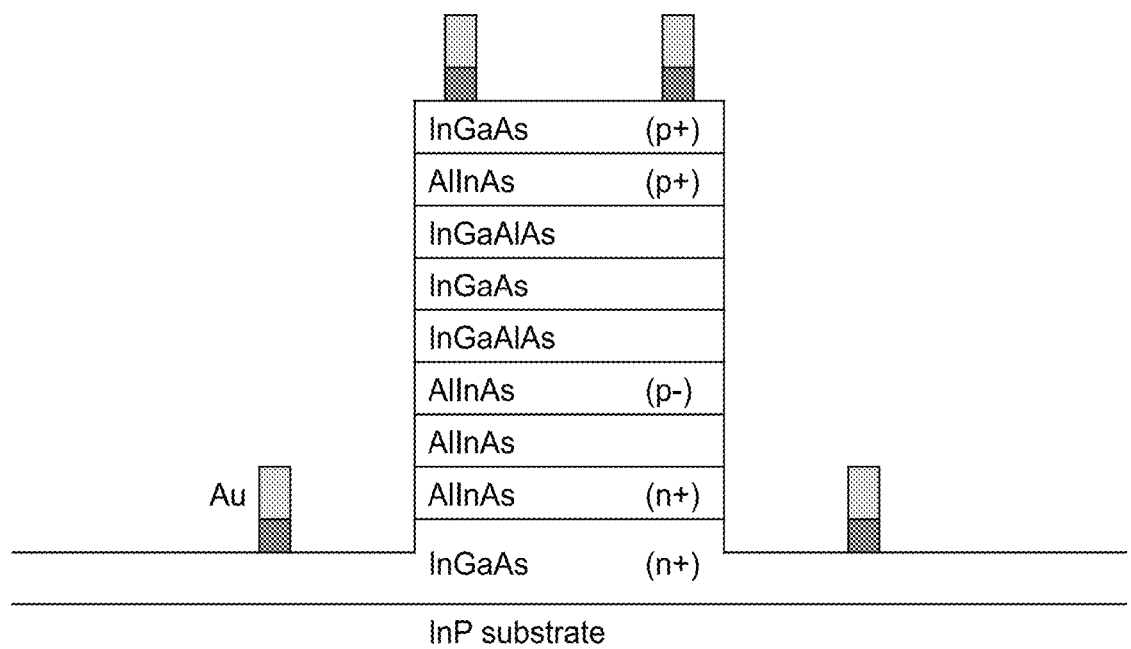

Next, in FIG. 25, the T/B ring is formed. This step may comprise: a reactive ion etch using O2, 15 s @~7 W, about 2-3 Torr, e.g., 2.25 Torr; an oxide etch; a metal evaporation process using 1,000 Å Ti @ 3 Å/s, e-beam, 2,000 Å Au @ 3 Å/s, thermal; a liftoff and strip of S1818 photoresist; and a strip of the LOR 10B.

Figure 26:
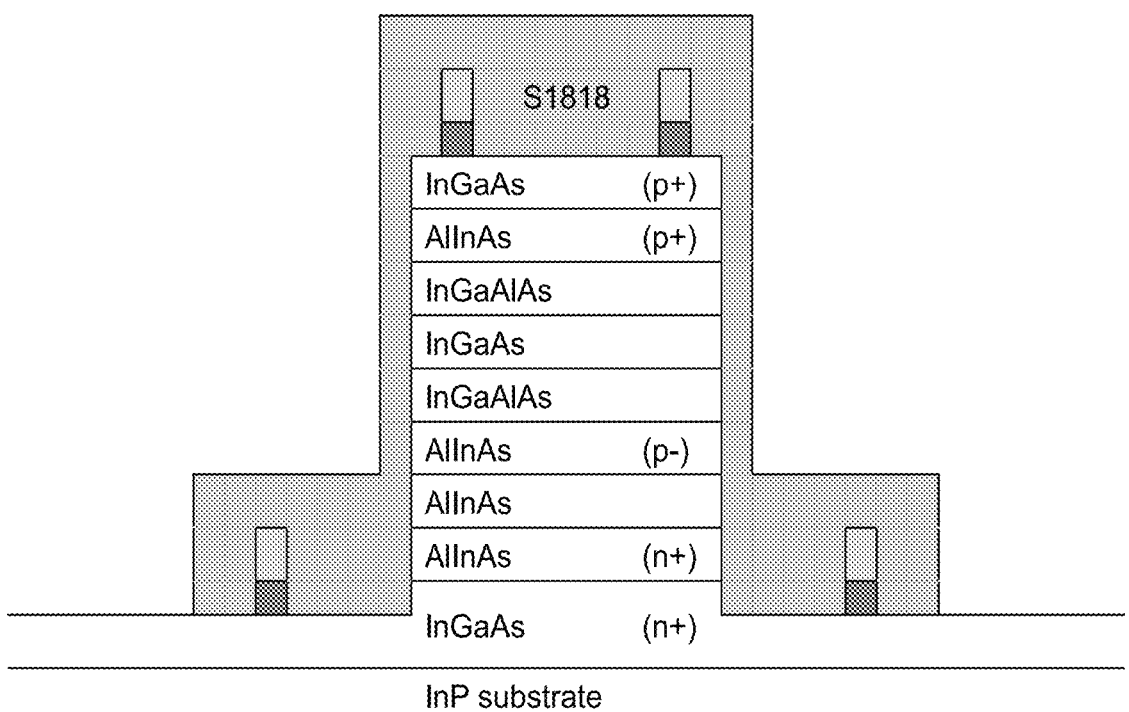

Next, in FIG. 26, an isolation etch is performed. This step may comprise: a solvent clean; a spin coat of S1818 photoresist; a softbake @ 90-100° C., e.g., 95° C.; an expose process @~24 mW/cm2; a develop process; and a hardbake 110-120° C., e.g., 115° C.

Figure 27:
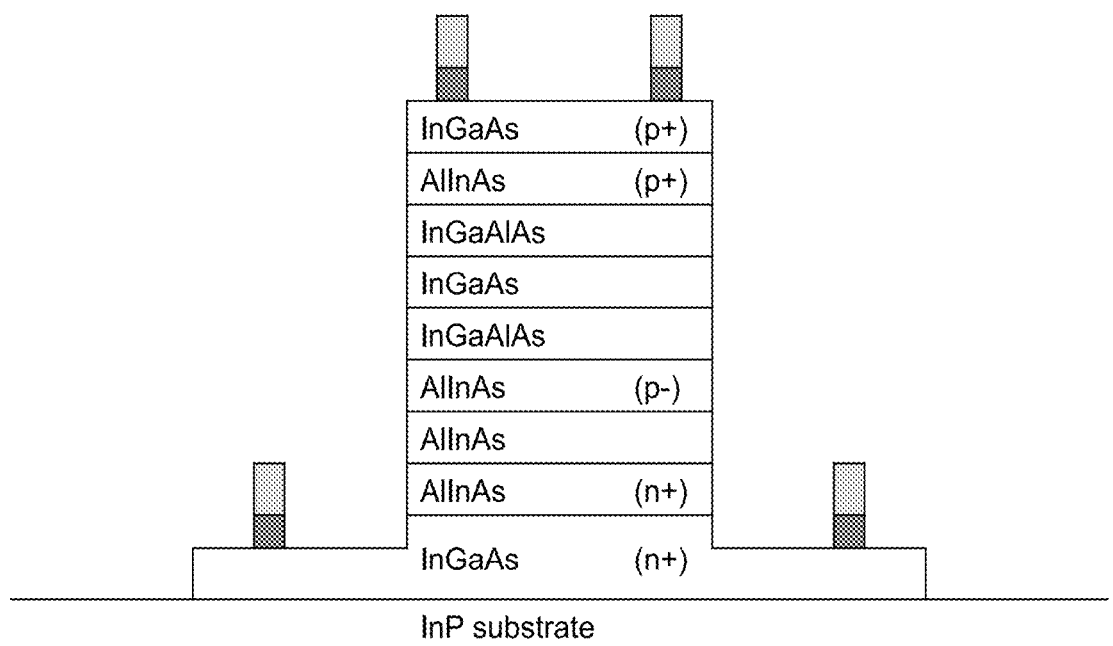

Next, in FIG. 27, the isolation etch is continued. This step may comprise: a etch ~3,000 Å (~10 mins) using DI H2O:H3PO4:H2O2 100:1:1 (vol.); and a strip of photoresist.

Figure 28:
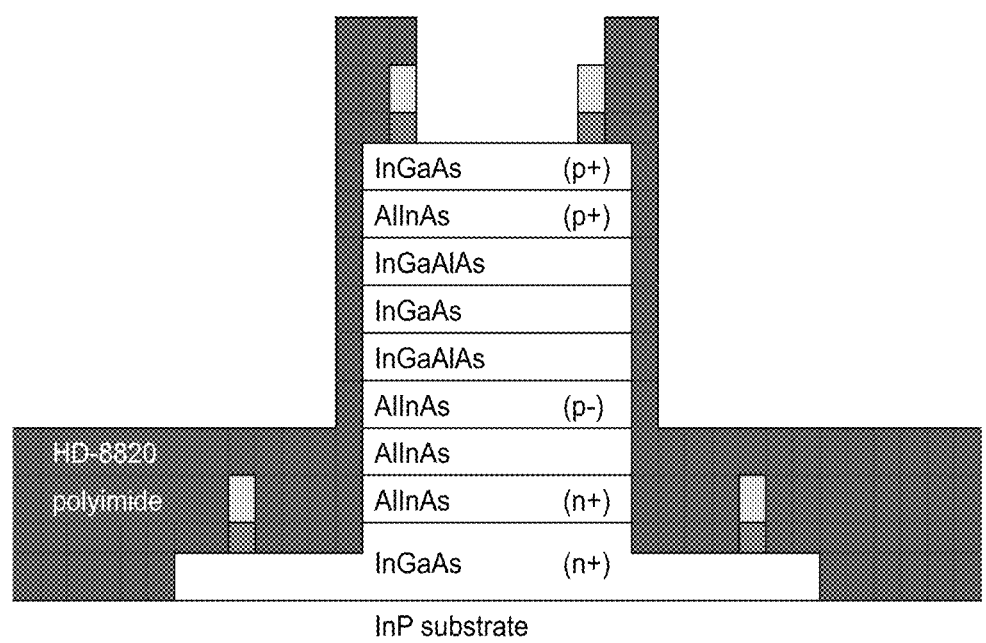

Next, in FIG. 28, a polyimide layer is formed. This step may comprise: a solvent clean; a spin coat HD-8820 polyimide using 4:1 (% wt.) HD-8820:T-9039; a softbake @ 120-150° C., e.g., at 135° C.; an expose of 40 s @~24 mW/cm2, a develop process; and a curing process using 450° C./hr to 100° C., 450° C./hr to 150° C., 225° C./hr to 222° C., and 150° C./hr to 100° C.

Figure 29:
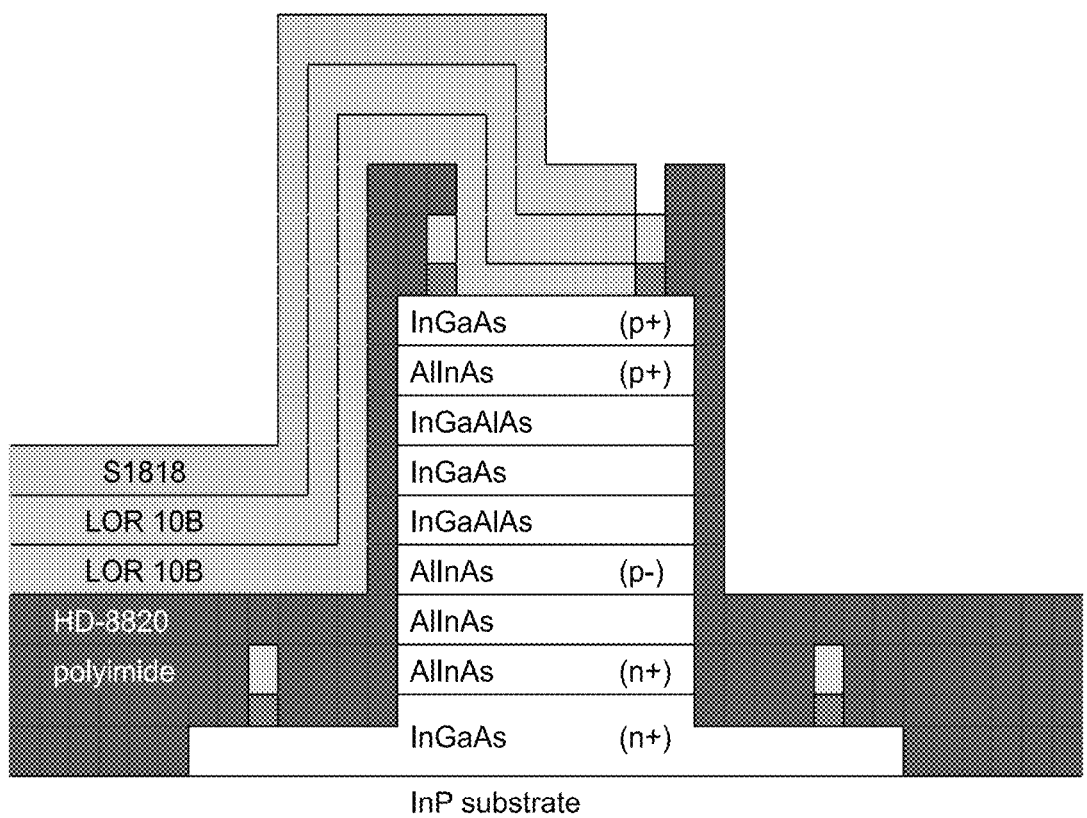

Next, in FIG. 29, a lithography for pad metal is performed. This step may comprise: a solvent clean; a spin coat of LOR 10B; a softbake of the LOR 190-200° C., e.g., 195° C.; a coat/softbake of a 2nd LOR layer; a spin coat of S1818 photoresist; a softbake of the photoresist @ 90-100° C., e.g., 95° C.; an expose @~24 mW/cm2; and a develop process.

Figure 30:
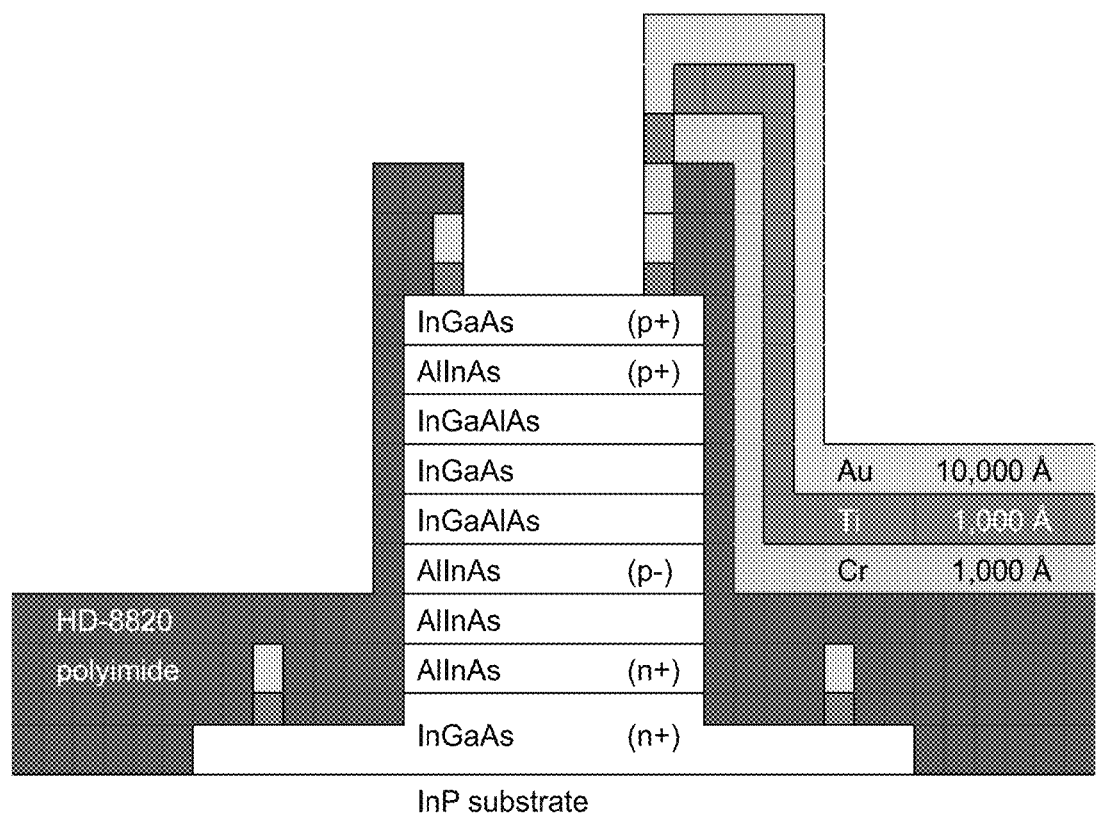

Finally, in FIG. 30, the pad metal is processed. This step may comprise: a reactive ion etch using O2, 30 s @~7 W, 2-3 Torr, e.g., 2.25 Torr; an oxide etch using 10:1 (vol.) DI water:HCl; a metal evaporation process using 1,000 Å Cr @ 3 Å/s, e-beam, 1,000 Å Ti @ 3 Å/s, e-beam, 10,000 Å Au @ 3 Å/s, thermal, a liftoff and strip of the S1818 photoresist; a strip of LOR 10B using remover 1165 @~90° C.→a 2nd remover 1165 bath→Isopropanol→DI water with agitation.

Conclusion

The various illustrative logical blocks, modules, and processes described herein may be implemented as electronic hardware, computer software, or combinations of both. To clearly illustrate this interchangeability of hardware and software, various illustrative components, blocks, modules, and states have been described above generally in terms of their functionality. However, while the various modules are illustrated separately, they may share some or all of the same underlying logic or code. Certain of the logical blocks, modules, and processes described herein may instead be implemented monolithically.

The various illustrative logical blocks, modules, and processes described herein may be implemented or performed by a machine, such as a computer, a processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor may be a microprocessor, a controller, microcontroller, state machine, combinations of the same, or the like. A processor may also be implemented as a combination of computing devices, e.g., a combination of a DSP and a microprocessor, a plurality of microprocessors or processor cores, one or more graphics or stream processors, one or more microprocessors in conjunction with a DSP, or any other such configuration.

The blocks or states of the processes described herein may be embodied directly in hardware, in a software module executed by a processor, or in a combination of the two. For example, each of the processes described above may also be embodied in, and fully automated by, software modules executed by one or more machines such as computers or computer processors. A module may reside in a computer-readable storage medium such as RAM memory, flash memory, ROM memory, EPROM memory, EEPROM memory, registers, hard disk, a removable disk, a CD-ROM, memory capable of storing firmware, or any other form of computer-readable storage medium known in the art. An exemplary computer-readable storage medium can be coupled to a processor such that the processor can read information from, and write information to, the computer-readable storage medium. In the alternative, the computer-readable storage medium may be integral to the processor. The processor and the computer-readable storage medium may reside in an ASIC.

Depending on the embodiment, certain acts, events, or functions of any of the processes or algorithms described herein can be performed in a different sequence, may be added, merged, or left out altogether. Thus, in certain embodiments, not all described acts or events are necessary for the practice of the processes. Moreover, in certain embodiments, acts or events may be performed concurrently, e.g., through multi-threaded processing, interrupt processing, or via multiple processors or processor cores, rather than sequentially.

Conditional language used herein, such as, among others, "can," "could," "might," "may," "e.g.," and from the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While the above detailed description has shown, described, and pointed out novel features as applied to various embodiments, it will be understood that various omissions, substitutions, and changes in the form and details of the logical blocks, modules, and processes illustrated may be made without departing from the spirit of the disclosure. As will be recognized, certain embodiments of the inventions described herein may be embodied within a form that does not provide all of the features and benefits set forth herein, as some features may be used or practiced separately from others.

All of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located, and may be cloud-based devices that are assigned dynamically to particular tasks. The results of the disclosed methods and tasks may be persistently stored by transforming physical storage devices, such as solid state memory chips and/or magnetic disks, into a different state.

The methods and processes described above may be embodied in, and fully automated via, software code modules executed by one or more general purpose computers. Some or all of the methods may alternatively be embodied in specialized computer hardware. Code modules or any type of data may be stored on any type of non-transitory computer-readable medium, such as physical computer storage including hard drives, solid state memory, random access memory (RAM), read only memory (ROM), optical disc, volatile or non-volatile storage, combinations of the same and/or the like. The methods and modules (or data) may also be transmitted as generated data signals (e.g., as part of a carrier wave or other analog or digital propagated signal) on a variety of computer-readable transmission mediums, including wireless-based and wired/cable-based mediums, and may take a variety of forms (e.g., as part of a single or multiplexed analog signal, or as multiple discrete digital packets or frames). The results of the disclosed methods may be stored in any type of non-transitory computer data repository, such as databases, relational databases and flat file systems that use magnetic disk storage and/or solid state RAM. Some or all of the components shown in the figures may be implemented in a cloud computing system that is accessible over a network, such as the Internet.

Further, certain implementations of the functionality of the present disclosure are sufficiently mathematically, computationally, or technically complex that application-specific hardware or one or more physical computing devices (utilizing appropriate executable instructions) may be necessary to perform the functionality, for example, due to the volume or complexity of the calculations involved or to provide results substantially in real-time.

Any processes, blocks, states, steps, or functionalities in flow diagrams described herein and/or depicted in the attached figures should be understood as potentially representing code modules, segments, or portions of code which include one or more executable instructions for implementing specific functions (e.g., logical or arithmetical) or steps in the process. The various processes, blocks, states, steps, or functionalities can be combined, rearranged, added to, deleted from, modified, or otherwise changed from the illustrative examples provided herein. In some embodiments, additional or different computing systems or code modules may perform some or all of the functionalities described herein. The methods and processes described herein are also not limited to any particular sequence, and the blocks, steps, or states relating thereto can be performed in other sequences that are appropriate, for example, in serial, in parallel, or in some other manner. Tasks or events may be added to or removed from the disclosed example embodiments. Moreover, the separation of various system components in the implementations described herein is for illustrative purposes and should not be understood as requiring such separation in all implementations. It should be understood that the described program components, methods, and systems can generally be integrated together in a single computer product or packaged into multiple computer products. Many implementation variations are possible.

The processes, methods, and systems may be implemented in a network (or distributed) computing environment. Network environments include enterprise-wide computer networks, intranets, local area networks (LAN), wide area networks (WAN), personal area networks (PAN), cloud computing networks, crowd-sourced computing networks, the Internet, and the World Wide Web. The network may be a wired or a wireless network or any other type of communication network.

The various elements, features and processes described herein may be used independently of one another, or may be combined in various ways. All possible combinations and subcombinations are intended to fall within the scope of this disclosure. Further, nothing in the foregoing description is intended to imply that any particular feature, element, component, characteristic, step, module, method, process, task, or block is necessary or indispensable. The example systems and components described herein may be configured differently than described. For example, elements or components may be added to, removed from, or rearranged compared to the disclosed examples.

As used herein any reference to "one embodiment" or "some embodiments" or "an embodiment" means that a particular element, feature, structure, or characteristic described in connection with the embodiment is included in at least one embodiment. The appearances of the phrase "in one embodiment" in various places in the specification are not necessarily all referring to the same embodiment. Conditional language used herein, such as, among others, "can," "could," "might," "may," "e.g.," and the like, unless specifically stated otherwise, or otherwise understood within the context as used, is generally intended to convey that certain embodiments include, while other embodiments do not include, certain features, elements and/or steps. In addition, the articles "a" and "an" as used in this application and the appended claims are to be construed to mean "one or more" or "at least one" unless specified otherwise.

As used herein, the terms "comprises," "comprising," "includes," "including," "has," "having" or any other variation thereof, are open-ended terms and intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present). As used herein, a phrase referring to "at least one of" a list of items refers to any combination of those items, including single members. As an example, "at least one of: A, B, or C" is intended to cover: A, B, C, A and B, A and C, B and C, and A, B, and C. Conjunctive language such as the phrase "at least one of X, Y and Z," unless specifically stated otherwise, is otherwise understood with the context as used in general to convey that an item, term, etc. may be at least one of X, Y or Z. Thus, such conjunctive language is not generally intended to imply that certain embodiments require at least one of X, at least one of Y and at least one of Z to each be present.

The foregoing disclosure, for purpose of explanation, has been described with reference to specific embodiments, applications, and use cases. However, the illustrative discussions herein are not intended to be exhaustive or to limit the inventions to the precise forms disclosed. Many modifications and variations are possible in view of the above teachings. The embodiments were chosen and described in order to explain the principles of the inventions and their practical applications, to thereby enable others skilled in the art to utilize the inventions and various embodiments with various modifications as are suited to the particular use contemplated.

The features and attributes of the specific embodiments disclosed above may be combined in different ways to form additional embodiments, all of which fall within the scope of the present disclosure. Although the present disclosure provides certain embodiments and applications, other embodiments that are apparent to those of ordinary skill in the art, including embodiments, which do not provide all of the features and advantages set forth herein, are also within the scope of this disclosure. Accordingly, the scope of the present disclosure is intended to be defined only by reference to the appended claims.

What is claimed is:

1. An electromagnetic sensor of an optical detection system, comprising:
   a Fresnel lens,
   an array of photodetectors having a pixel pitch from about 150 μm to 210 μm enabling an angular coverage of up to 360°, the Fresnel lens coupled at an aperture of the array, the Fresnel lens adapted to collect incident optical signals and focus same onto the array, the array adapted to convert the optical signals into electrical outputs, the electrical outputs analyzed by the optical detection system to determine, for each optical signal, an incident angle of arrival of thereof, a range of a source of the optical signal to the sensor that is determined from the calculated angle of arrival, the electrical outputs further analyzed to minimize a false alarm rate by discriminating each optical signal spectrally to calculate a wavelength thereof, so as to distinguish whether an incident optical signal is from a narrowband laser source operating at a single wavelength or from a broadband light source operating at a continuum of wavelengths.

2. The sensor of claim 1, wherein each photodetector comprises an amplifier.

3. The sensor of claim 1, wherein the array of photodetectors further includes a two dimensional (2D) detector array of avalanche photodiodes (APDs).

4. The sensor of claim 1, further comprising:
   a transmission grating with cylindrical lens attached thereto, wherein
   the array of photodetectors further includes a linear (1D) detector array coupled to the grating and to the cylindrical lens, each of the incident optical signals passing through the grating, which disperses photons thereof spatially depending on wavelength, the photons collected by the cylindrical lens and directed to the 1D detector array for conversion into electrical outputs, to be analyzed spectrally for wavelength determination to minimize false alarms.

5. The sensor of claim 1, wherein the sensor has a minimum detectable intensity of 10 nanowatts per square centimeter.

6. The sensor of claim 1, wherein the array of photodetectors is embodied as an array of avalanche photodiodes (APDs) having a breakdown voltage of 35 volts, a dark current of less than 100 nA, and an optical gain between 10-15 A/W.

7. The sensor of claim 1, wherein Fresnel equations are employed to determine the angle of arrival and range.

8. An optical detection system, comprising:
   an optical package,
   a two dimensional (2D) detector array of photodetectors having a pixel pitch from about 150 μm to 210 μm enabling an angular coverage of up to 360°, the 2D detector array coupled to the optical package, the optical package adapted to collect incident optical signals and focus same onto the 2D detector array, the 2D detector array adapted to convert the optical signals into electrical outputs, and
   a processor coupled to the 2D detector array, the processor adapted to analyze the electrical outputs and determine, for each optical signal, an incident angle of arrival thereof and a range of a source of the optical signal to the sensor based on the angle of arrival determination, wherein Fresnel equations are employed to determine the angle of arrival and range.

9. The system of claim 8, wherein the 2D detector array is configured to detect optical signals having a wavelength in a range of about 200 nm to 3000 nm.

10. The system of claim 8, wherein the processor is further configured to discriminate each of the optical signals spectrally to calculate wavelengths thereof, so as to distinguish whether an incident optical signal is from a narrowband laser source operating at a single wavelength or from a broadband source operating at a plurality of individual wavelengths.

11. The system of claim 8, wherein the detector array comprises a plurality of avalanche photodiodes sensitive to a nanowatt per square centimeter of optical energy.

12. A laser warning receiver (LWR) adapted to detect an optical signal incident from a hostile source, comprising:

a sensor adapted to collect the incident optical signal, the sensor including a detector array of photodetectors having a pixel pitch from about 150 μm to 210 μm enabling an angular coverage of up to 360°, the detector array adapted to convert the collected incident optical signal into a photocurrent for output from the sensor, a sensor interface coupled to the sensor and adapted to convert the photocurrent into output voltages and signals for analysis, and a processor coupled to the sensor interface, the processor adapted to iterate algorithms using the output voltages and signals to calculate an incident angle of arrival for the incident optical signal and a range of the hostile source of the optical signal to the LWR based on the angle of arrival calculation, the processor further configured to discriminate the optical signal spectrally to calculate wavelengths thereof for false alarm rejection.

13. The LWR of claim 12, wherein the sensor further includes:

a doublet Fresnel lens adapted to collect the incident optical signal for two dimensional (2D) angle resolving detection thereof, and the detector array is a two dimensional (2D) detector array of avalanche photodiodes (APDs) which are coupled to the Fresnel lens to convert the signal into a photocurrent, wherein output voltages and signals converted from the 2D detector array photocurrent by the sensor interface are employed with Fresnel equations in algorithms iterated by the processor to determine the angle of arrival and range.

14. The LWR of claim 13, wherein the 2D detector array has a breakdown voltage of 35 volts, a dark current of less than 100 nA, and an optical gain between 10-15 A/W.

15. The LWR of claim 12, wherein the sensor further includes:

a transmission grating with cylindrical lens attached thereto, and a linear (1D) detector array coupled to the grating and to the cylindrical lens, the incident optical signal passing through the grating, which disperses photons thereof spatially depending on wavelength, the photons collected by the cylindrical lens and directed to the 1D detector array for conversion into photocurrents, the output voltages and signals converted therefrom by the sensor interface analyzed spectrally by the processor for wavelength determination to minimize false alarms.

16. The LWR of claim 12, wherein the sensor interface is a readout integrated circuit.

17. The LWR of claim 12, wherein the sensor has a minimum detectable intensity of 10 nanowatts per square centimeter.

* * * * *